(12) United States Patent
Bergendahl et al.

(10) Patent No.: US 8,906,807 B2
(45) Date of Patent: Dec. 9, 2014

(54) SINGLE FIN CUT EMPLOYING ANGLED PROCESSING METHODS

(71) Applicant: International Business Machines Corporation, Armonk, NY (US)

(72) Inventors: Marc A. Bergendahl, Albany, NY (US); David V. Horak, Albany, NY (US); Charles W. Koburger, III, Delmar, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 13/648,321

(22) Filed: Oct. 10, 2012

(65) Prior Publication Data

US 2014/0099792 A1    Apr. 10, 2014

(51) Int. Cl.
*H01L 21/311* (2006.01)
*H01L 27/12* (2006.01)

(52) U.S. Cl.
CPC .......... *H01L 21/311* (2013.01); *H01L 27/1211* (2013.01)
USPC ......................................... 438/696; 438/197

(58) Field of Classification Search
CPC .............. H01L 21/311; H01L 21/3086; H01L 27/1104; H01L 27/1211
USPC ................................................... 438/696, 197
See application file for complete search history.

(56) References Cited

U.S. PATENT DOCUMENTS

| | | | |
|---|---|---|---|
| 7,074,656 | B2 | 7/2006 | Yeo et al. |
| 7,701,008 | B2 | 4/2010 | Yeo et al. |
| 8,114,751 | B2 | 2/2012 | Ishiguro et al. |
| 8,129,778 | B2 | 3/2012 | Kim et al. |
| 2004/0217433 | A1 | 11/2004 | Yeo et al. |
| 2009/0124069 | A1 | 5/2009 | Clark, Jr. et al. |
| 2011/0175165 | A1 | 7/2011 | Yu et al. |

*Primary Examiner* — Nadine Norton
*Assistant Examiner* — Mahmoud Dahimene
(74) *Attorney, Agent, or Firm* — Scully, Scott, Murphy & Presser, P.C.; Catherine Ivers, Esq.

(57) ABSTRACT

Fin-defining spacers are formed on an array of mandrel structure. Mask material portions can be directionally deposited on fin-defining spacers located on one side of each mandrel structure, while not deposited on the other side. A photoresist layer is subsequently applied and patterned to form an opening, of which the overlay tolerance increases by a pitch of fin-defining spacers due to the mask material portions. Alternately, a conformal silicon oxide layer can be deposited on fin-defining spacers and structure-damaging ion implantation is performed only on fin-defining spacers located on one side of each mandrel structure. A photoresist layer is subsequently applied and patterned to form an opening, from which a damaged silicon oxide portion and an underlying fin-defining spacer are removed, while undamaged silicon oxide portions are not removed. An array of semiconductor fins including a vacancy can be formed by transferring the pattern into a semiconductor layer.

20 Claims, 18 Drawing Sheets

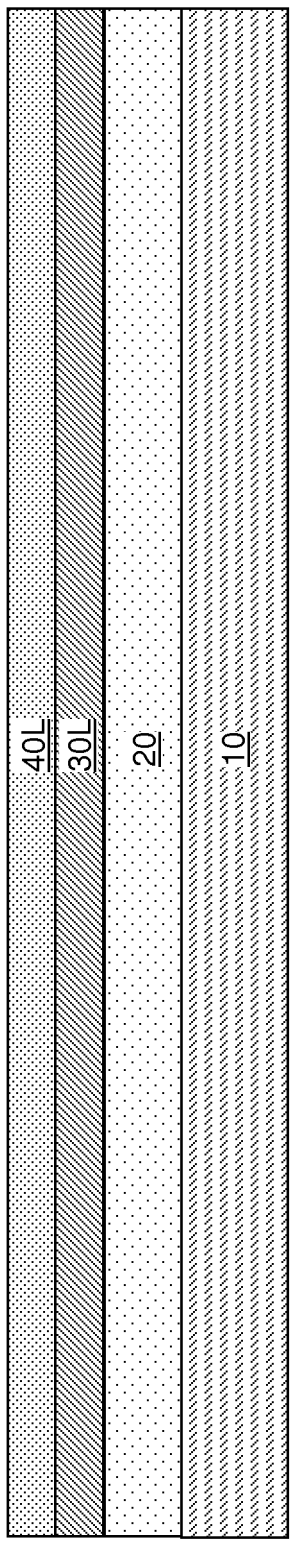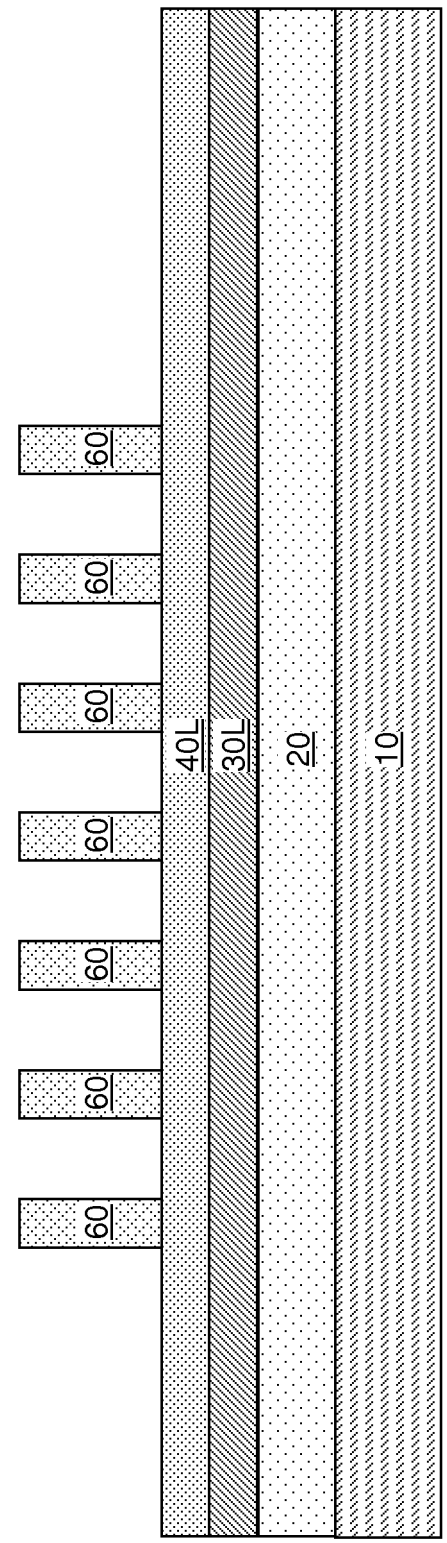
FIG. 1
FIG. 2

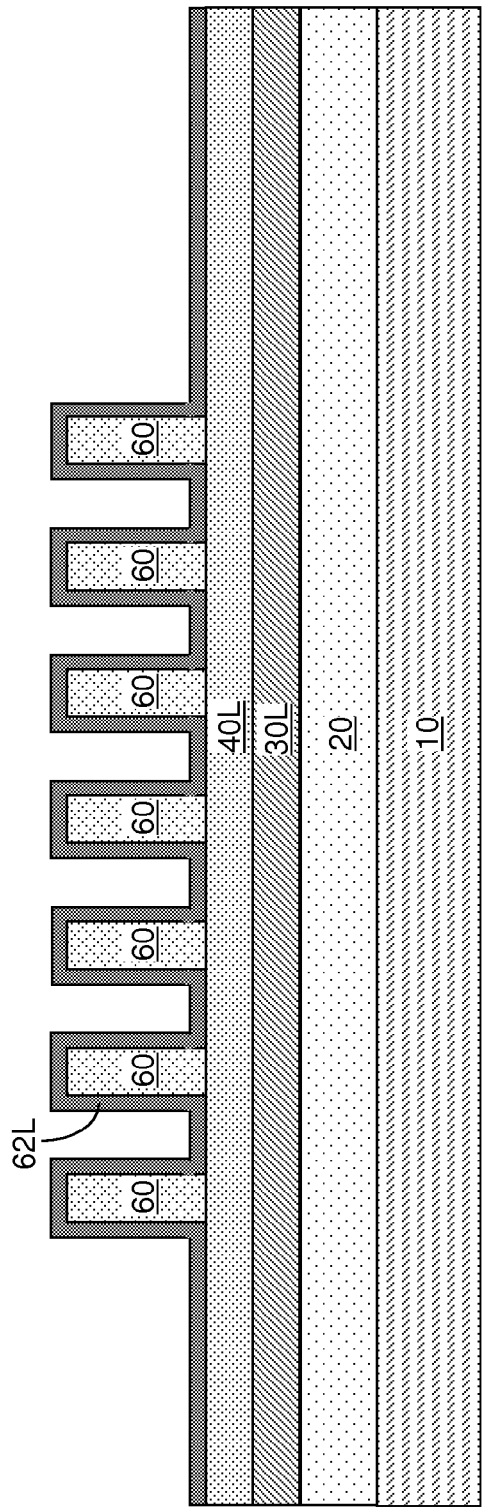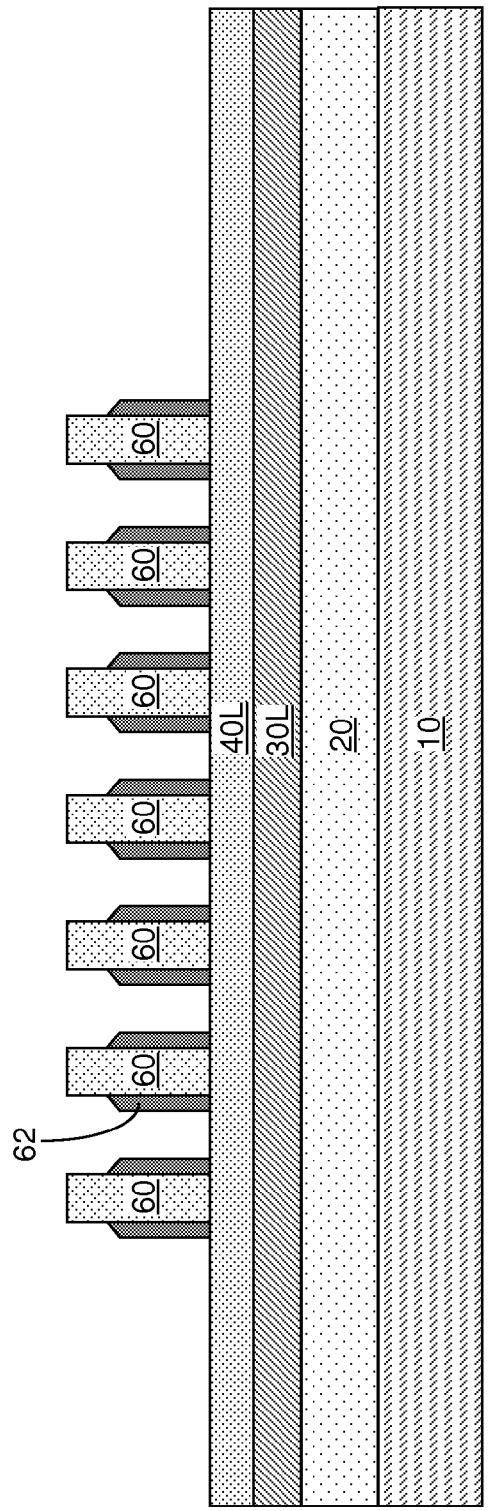

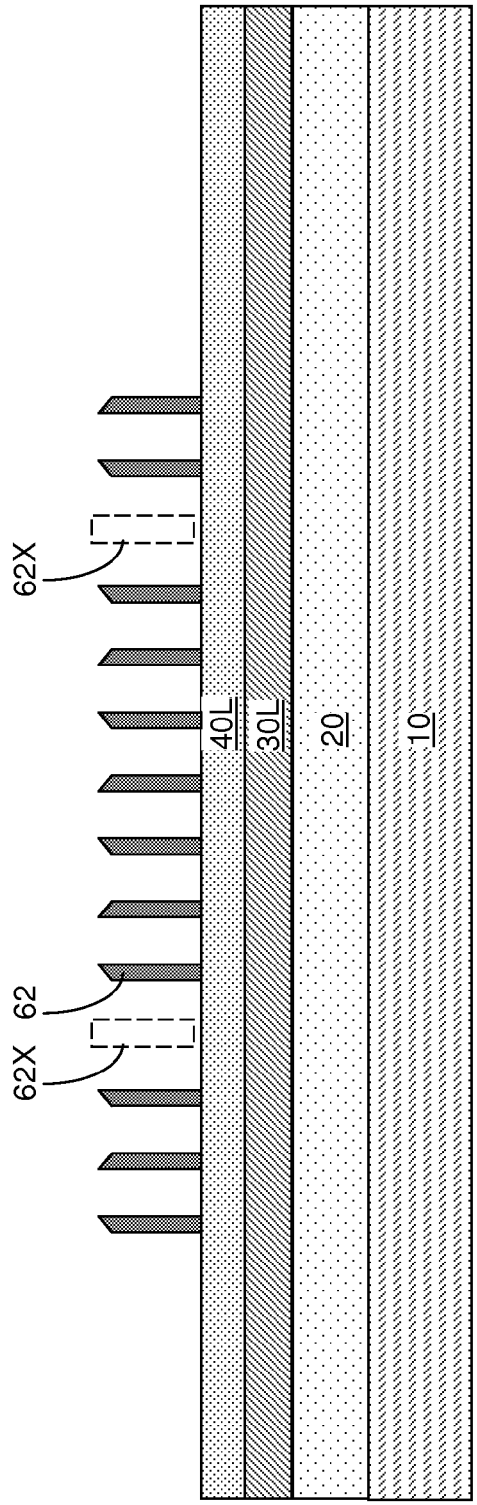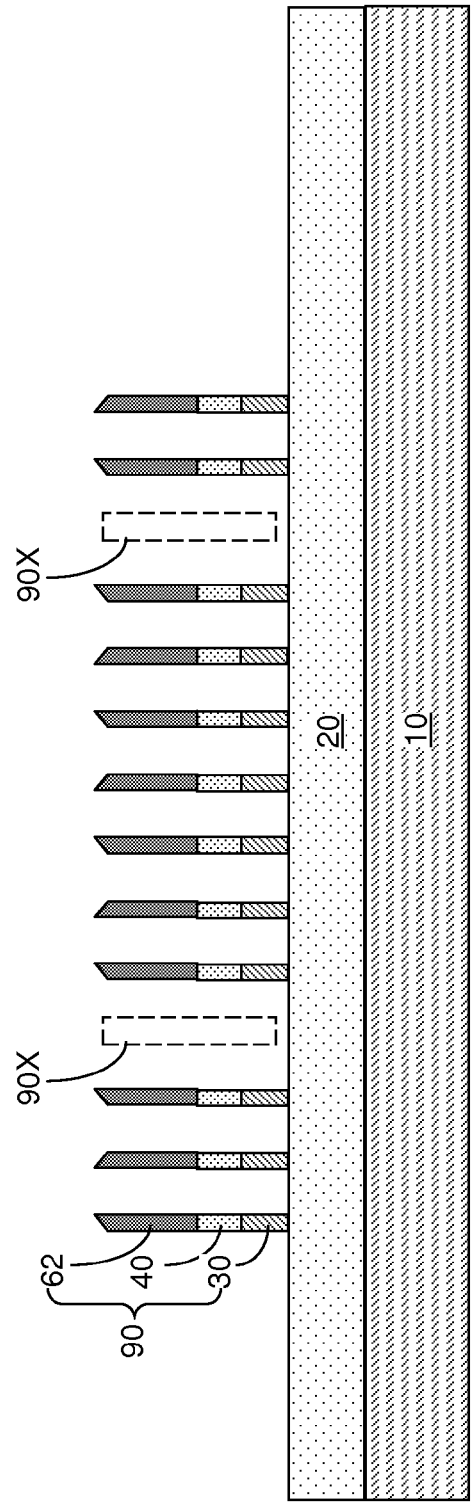

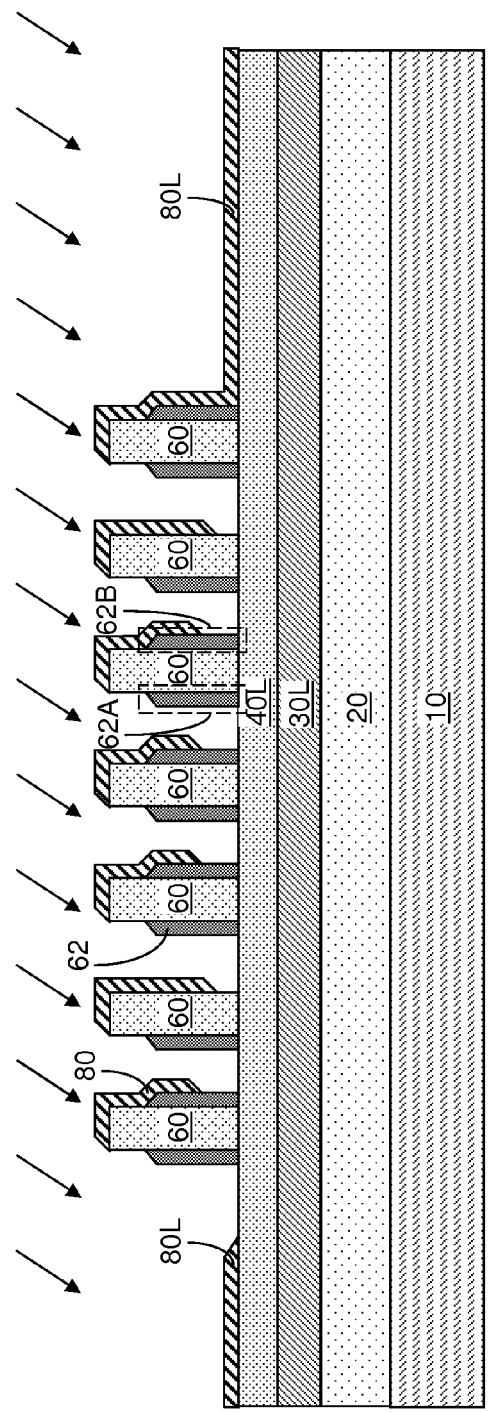
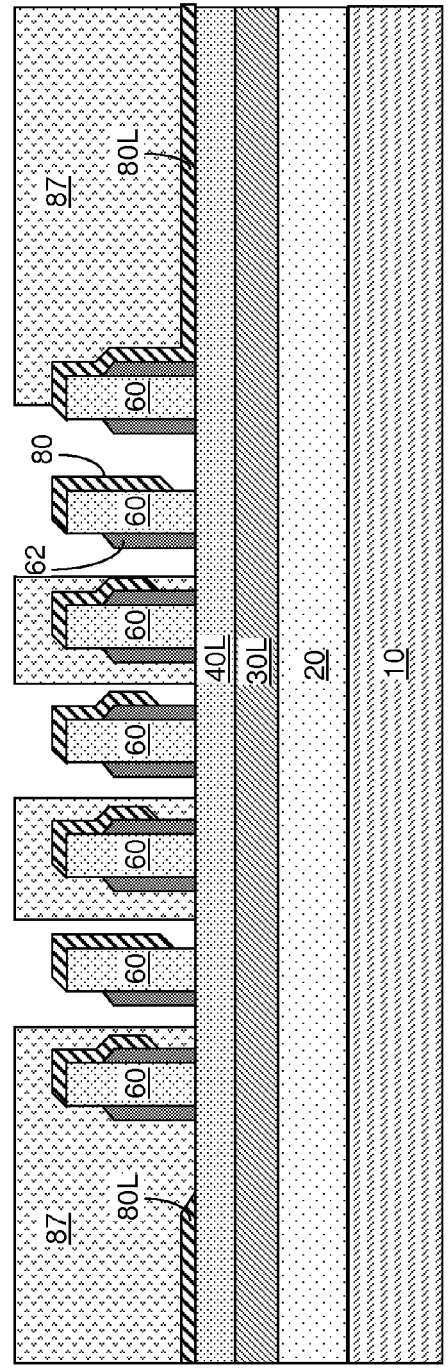
FIG. 13
FIG. 14

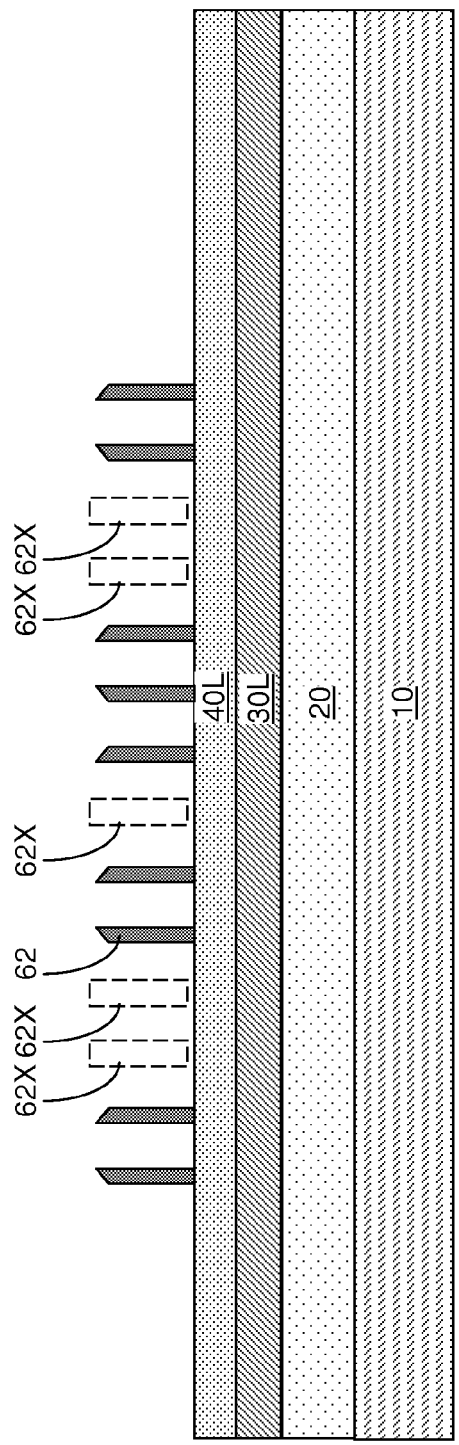
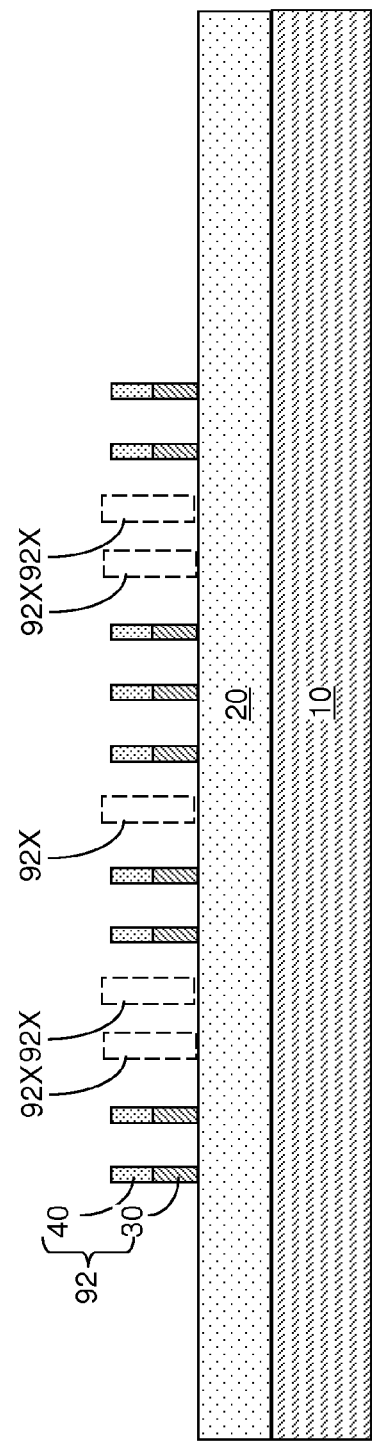

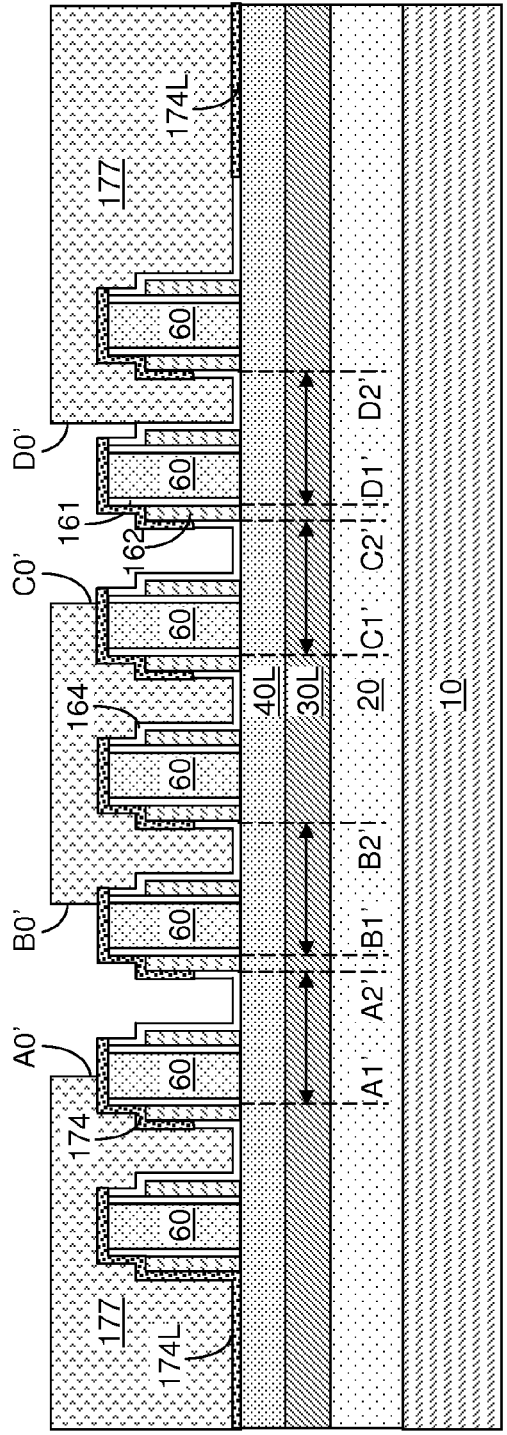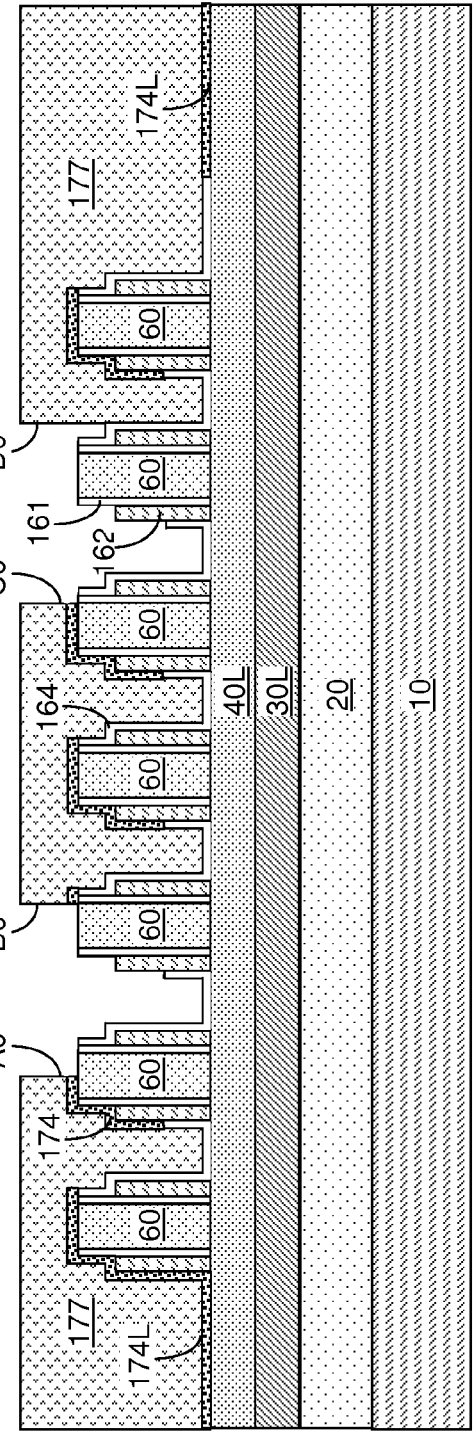

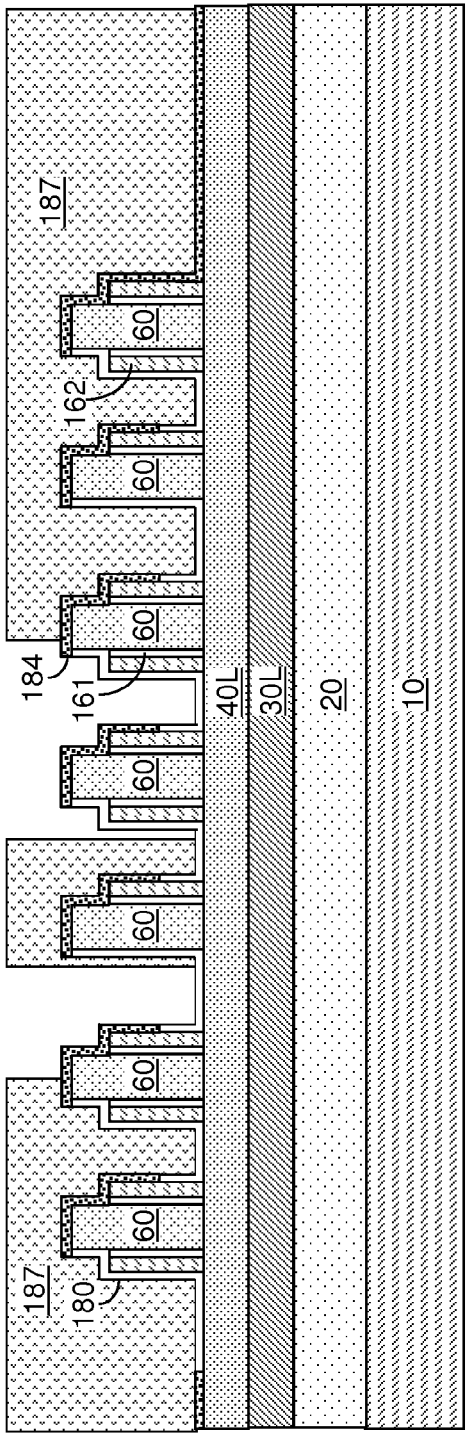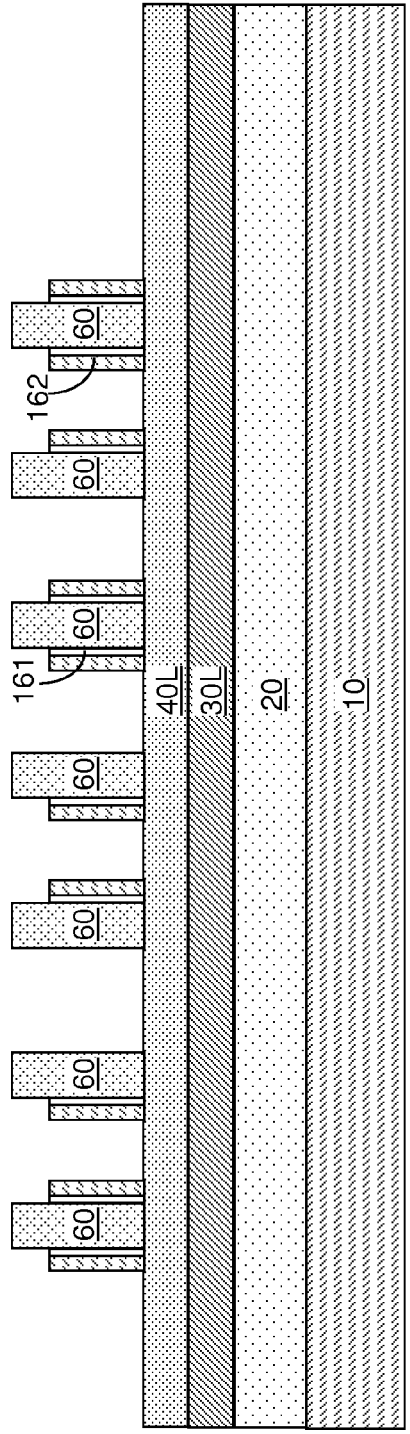

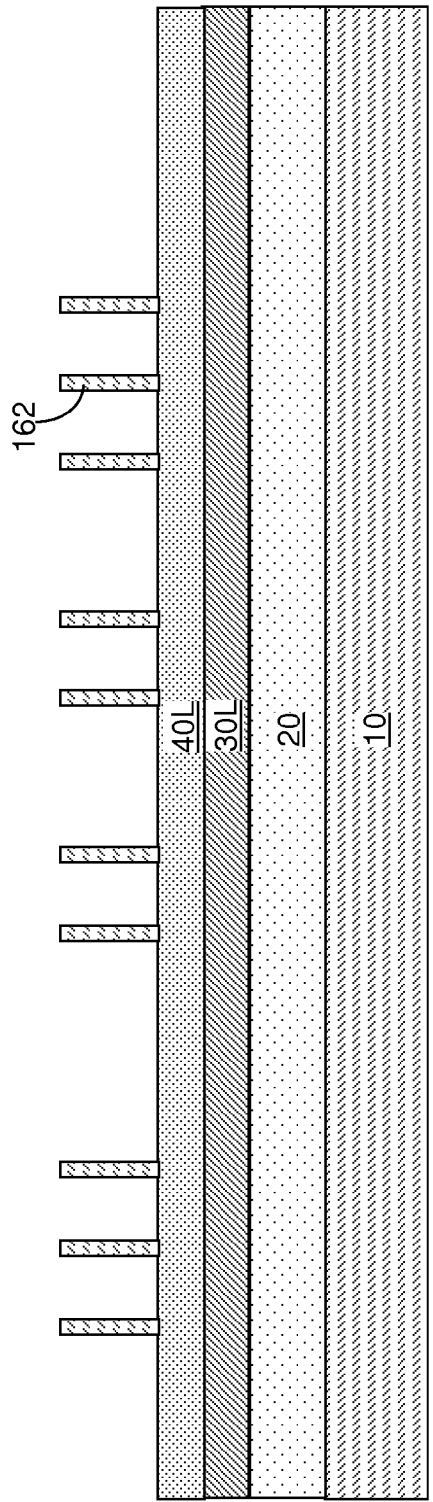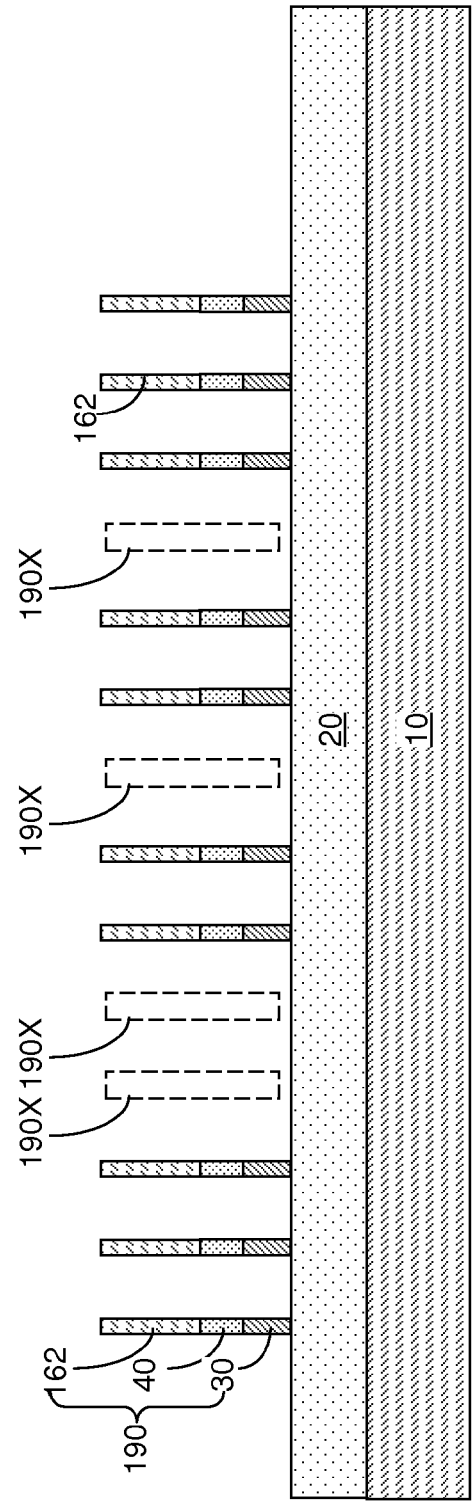

SINGLE FIN CUT EMPLOYING ANGLED PROCESSING METHODS

BACKGROUND

The present disclosure relates to methods of forming a semiconductor structure, and particularly to methods of forming a vacancy of a semiconductor fin within an array of semiconductor fins.

Fin field effect transistors (finFETs) employ semiconductor fins, which introduce on-wafer topography. The semiconductor fins are often formed as an array of semiconductor fins having a periodicity in order to minimize etch bias due to pattern factor, i.e., the fraction of the area of the semiconductor fins within a unit area. In this case, some of the semiconductor fins need to be removed after formation of the array of semiconductor fins in order to provide isolated semiconductor fins or a cluster of semiconductor fins spaced from other clusters of semiconductor fins.

In order to remove a single semiconductor fin while protecting adjacent semiconductor fins, a lithographically patterned mask needs to physically expose the single semiconductor fin while covering the adjacent semiconductor fins. Thus, two sidewalls of a patterned photoresist need to be positioned within the spaces between the single semiconductor fin and the two adjacent semiconductor fins in order to ensure that only a single semiconductor fin is removed without removing any additional semiconductor fins. However, as the pitch of the semiconductor fins decreases, it becomes difficult to remove a single semiconductor fin while protecting adjacent semiconductor fins because of overlay tolerances of lithographic processes. As of 2012, single fin cut for a fin pitch less than 40 nm is very challenging. Thus, a method is desired for ensuring that only a single semiconductor fin can be removed from an array of semiconductor fins while reliably protecting adjacent semiconductor fins.

SUMMARY

An array of mandrel structures is formed over a stack of a semiconductor layer and a dielectric cap layer. Fin-defining spacers are formed on the array of mandrel structures by a conformal deposition and an isotropic etch of a material layer. In one embodiment, mask material portions are directionally deposited on fin-defining spacers located on one side of each mandrel structure, while not deposited on fin-defining spacers located on the other side of each mandrel structure. A photoresist layer is subsequently applied and patterned to form an opening, of which the overlay tolerance increases by a pitch of fin-defining spacers due to the mask material portions. In another embodiment, a conformal silicon oxide layer is deposited on fin-defining spacers and structure-damaging ion implantation is performed on fin-defining spacers located on one side of each mandrel structure, while fin-defining spacers located on the other side of each mandrel structure are not damaged. A photoresist layer is subsequently applied and patterned to form an opening, from which a damaged silicon oxide portion and an underlying fin-defining spacer are removed, while undamaged silicon oxide portions are not removed. An array of semiconductor fins including a vacancy can be formed by transferring the pattern into an underlying semiconductor layer.

According to an aspect of the present disclosure, a method of forming a semiconductor structure is provided. Mandrel structures are formed over a stack of a semiconductor layer and a dielectric layer. Fin-defining spacers are formed on sidewalls of the mandrel structures. Mask material portions are formed on first fin-defining spacer portions located on a first-side sidewall of each mandrel structure by a directional deposition of a mask material. The mandrel structures shield second fin-defining spacer portions located on a second-side sidewall of each mandrel structure from the mask material during the directional deposition. A patterned mask layer including at least one opening therein is formed over the mandrel structures, fin-defining spacers, and the mask material portions. Portions of the fin-defining spacers located within the at least one opening and not covered by the mask material portions are removed in an anisotropic etch, while a subset of the mask material portions within the at least one opening protect underlying portions of the fin-defining spacers during the anisotropic etch.

According to another aspect of the present disclosure, a method of forming a semiconductor structure is provided. Mandrel structures are formed over a stack of a semiconductor layer and a dielectric layer. Fin-defining spacers are formed on sidewalls of the mandrel structures. A contiguous oxide layer is formed on the fin-defining spacers, the mandrel structures, and the dielectric layer. Structurally-damaged oxide portions are formed on first portions of the fin-defining spacers by implanting ions into portions of the contiguous oxide layer employing a directional ion implantation. The mandrel structures shield second portions of the fin-defining spacers from the ions during the directional ion implantation. A patterned mask layer including at least one opening therein is formed over structurally-damaged oxide portions and unimplanted portions of the contiguous oxide layer. A subset of the structurally-damaged oxide portions is removed from within the at least one opening, while the unimplanted portions of the contiguous oxide layer protect underlying portions of the fin-defining spacers within the at least one opening.

BRIEF DESCRIPTION OF SEVERAL VIEWS OF THE DRAWINGS

FIG. 1 is a vertical cross-sectional view of a first exemplary semiconductor structure after formation of a dielectric fin cap layer on a semiconductor-on-insulator (SOI) substrate according to a first embodiment of the present disclosure.

FIG. 2 is a vertical cross-sectional view of the first exemplary semiconductor structure after formation of mandrel structures on the dielectric fin cap layer according to the first embodiment of the present disclosure.

FIG. 3 is a vertical cross-sectional view of the first exemplary semiconductor structure after formation of fin-defining dielectric material layer according to the first embodiment of the present disclosure.

FIG. 4 is a vertical cross-sectional view of the first exemplary semiconductor structure after patterning of fin-defining dielectric material layer into a plurality of fin-defining spacers according to the first embodiment of the present disclosure.

FIG. 9 is a vertical cross-sectional view of the first exemplary semiconductor structure after removal of the mandrel structures according to the first embodiment of the present disclosure.

FIG. 10 is a vertical cross-sectional view of the first exemplary semiconductor structure after formation of the vertical stacks of a semiconductor fin, a dielectric fin cap, and a fin-defining spacer by an anisotropic etch according to the first embodiment of the present disclosure.

FIG. 13 is a vertical cross-sectional view of a variation of the first exemplary semiconductor structure after formation of second mask material portions according to the first embodiment of the present disclosure.

FIG. 14 is a vertical cross-sectional view of the variation of the first exemplary semiconductor structure after formation of a second patterned mask layer according to the second embodiment of the present disclosure.

FIG. 15 is a vertical cross-sectional view of the variation of the first exemplary semiconductor structure after removal of the second patterned mask layer and the second mask material portions according to the first embodiment of the present disclosure.

FIG. 16 is a vertical cross-sectional view of the variation of the first exemplary structure after formation of vertical stacks of a semiconductor fin and a fin cap dielectric according to the first embodiment of the present disclosure.

FIG. 21 is a vertical cross-sectional view of the second exemplary structure after formation of a patterned mask layer according to the second embodiment of the present disclosure.

FIG. 22 is a vertical cross-sectional view of the second exemplary structure after removal of physically exposed portions of the structurally-damaged oxide portions according to the second embodiment of the present disclosure.

FIG. 27 is a vertical cross-sectional view of the second exemplary structure after formation of a second patterned mask layer according to the second embodiment of the present disclosure.

FIG. 28 is a vertical cross-sectional view of the second exemplary structure after removal of physically exposed portions of the structurally-damaged oxide portions, physically exposed fin-defining spacers, and the patterned mask layer according to the second embodiment of the present disclosure.

FIG. 29 is a vertical cross-sectional view of the second exemplary structure after removal of the mandrel structures according to the second embodiment of the present disclosure.

FIG. 30 is a vertical cross-sectional view of the second exemplary structure after formation of the vertical stacks of a semiconductor fin, a dielectric fin cap, and a fin-defining spacer by an anisotropic etch according to the second embodiment of the present disclosure.

DETAILED DESCRIPTION

Figure 5:
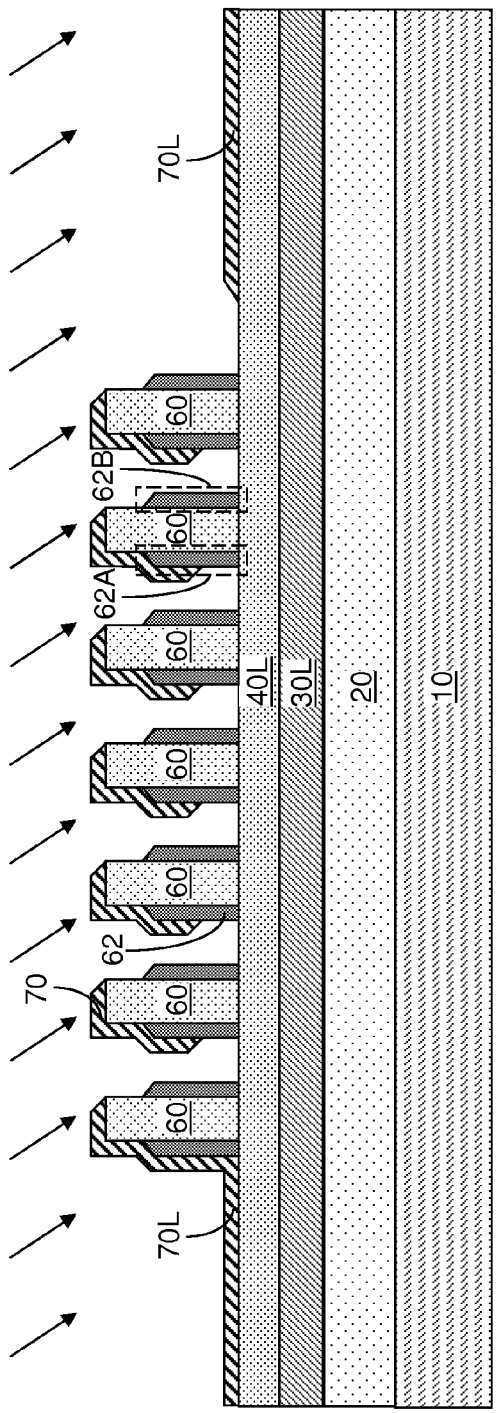
FIG. 5 is a vertical cross-sectional view of the first exemplary semiconductor structure after formation of mask material portions according to the first embodiment of the present disclosure.

As stated above, the present disclosure relates to methods of forming a vacancy of a semiconductor fin within an array of semiconductor fins. Aspects of the present disclosure are now described in detail with accompanying figures. It is noted that like reference numerals refer to like elements across different embodiments. The drawings are not necessarily drawn to scale.

Referring to FIG. 1, a first exemplary semiconductor structure according to an embodiment of the present disclosure includes a semiconductor substrate and a dielectric fin cap layer 40L formed thereupon. In one embodiment, the semiconductor substrate can be a semiconductor-on-insulator (SOI) substrate including a stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 is an insulator layer including a dielectric material such as silicon oxide, silicon nitride, silicon oxynitride, or a combination thereof. The thickness of the buried insulator layer 20 can be from 10 nm to 5 microns, although lesser and greater thicknesses can also be employed.

The top semiconductor layer 30L is a semiconductor material layer including a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may or may not be doped with p-type dopants and/or n-type dopants. The first semiconductor material can be a single crystalline semiconductor material, a polycrystalline semiconductor material, or an amorphous semiconductor material. In one embodiment, the first semiconductor material can be silicon. In one embodiment, the first semiconductor material can be single crystalline silicon. The thickness of the top semiconductor layer 30L can be from 10 nm to 200 nm, although lesser and greater thicknesses can also be employed.

The dielectric fin cap layer 40L can include, for example, silicon oxide, silicon oxynitride, a dielectric metal oxide, or a combination thereof. The dielectric fin cap layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the dielectric fin cap layer 40L can be from 2 nm to 30 nm, although lesser and greater thicknesses can also be employed. The second dielectric layer 50L can be formed, for example, by CVD.

While an embodiment employing an SOI substrate is employed to describe features of the present disclosure, embodiments employing a bulk semiconductor substrate instead of an SOI substrate can also be employed provided that suitable electrical isolation is provided between adjacent finFET devices, for example, by reversed biased p-n junctions and/or shallow trench isolation structures.

Referring to FIG. 2, mandrel structures 60 having parallel vertical sidewalls can be formed on the top surface of the dielectric fin cap layer 40L. For example, a mandrel material layer can be deposited over the dielectric fin cap layer 40L. The mandrel material layer includes a material that can be removed selective to the materials of the dielectric fin cap layer 40L. In one embodiment, the mandrel material layer can include amorphous silicon, polysilicon, amorphous or polycrystalline germanium, an amorphous or polycrystalline silicon-germanium alloy material, amorphous carbon, diamond-like carbon, or organosilicate glass. The thickness of the mandrel material layer can be, for example, from 30 nm to 300 nm, although lesser and greater thicknesses can also be employed. The mandrel material layer can be deposited, for example, by chemical vapor deposition (CVD).

The mandrel material layer can be patterned to form a plurality of mandrel structures 60. The patterning of the mandrel material layer can be performed, for example, by applying a photoresist layer (not shown) above the mandrel material layer, lithographically patterning the photoresist layer to define a set of areas covered by the patterned photoresist layer, and transferring the pattern in the photoresist layer into the mandrel material layer by an anisotropic etch. The anisotropic etch can be selective to the dielectric materials of the dielectric fin cap layer 40L. The patterned portions of the mandrel material layer constitute the plurality of mandrel structures 60.

In one embodiment, each of the plurality of mandrel structures 60 can have a rectangular horizontal cross-sectional shape. In one embodiment, the plurality of mandrel structures 60 can have the same rectangular horizontal cross-sectional shape. In one embodiment, the mandrel structures 60 can form a one-dimensional array of periodic patterns that is repeated along a horizontal direction, e.g., along the horizontal direction within the plane of the vertical cross-sectional view of FIG. 2. In this case, the plurality of mandrel structures 60 constitutes a one-dimensional array of mandrel structures 60 having a pitch along the horizontal direction perpendicular to the parallel vertical sidewalls of the mandrel structures 60.

In one embodiment, the width of each mandrel structures 60 within a one-dimensional periodic pattern of the plurality of mandrel structures 60 can be less than the spacing between adjacent mandrel structures 60. In other words, the width of each mandrel structures 60 within a one-dimensional periodic pattern of the plurality of mandrel structures 60 can be less than one half of the pitch of the one-dimensional periodic pattern of the plurality of mandrel structures 60. In one embodiment, the width of each mandrel structures 60 within a one-dimensional periodic pattern of the plurality of mandrel structures 60 can be selected to be less than one half of the pitch of the one-dimensional periodic pattern of the plurality of mandrel structures 60 by the thickness of a fin-defining material layer to be subsequently deposited on the plurality of mandrel structures 60.

Referring to FIG. 3, a fin-defining material layer 62L is deposited on all physically exposed surfaces of the plurality of mandrel structures 60 and the dielectric fin cap layer 40L. Portions of the fin-defining material layer 62L are subsequently employed to define shapes of semiconductor fins. Further, the lateral thickness of the fin-defining material layer 62L as measured on sidewalls of the plurality of mandrel structures 60 define the lateral width of each semiconductor fin to be subsequently formed. In addition, the locations of the semiconductor fins to be subsequently formed are defined by the locations of the vertical portions of the fin-defining material layer 62L. Because the locations and features of the fin-defining material layer 62 define locations and features of the semiconductor fins to be subsequently formed, the fin-defining material layer 62 are herein referred to as a "fin-defining" dielectric layer.

In one embodiment, the fin-defining material layer 62L can include a dielectric material that is different from the dielectric material of the dielectric fin cap layer 40L, or a semiconductor material such as amorphous silicon. If the plurality of mandrel structures 60 includes a dielectric material, the fin-defining material layer 62L includes a dielectric material that is different from the dielectric material of the plurality of mandrel structures 60. In one embodiment, the fin-defining material layer 62L can include silicon nitride, a dielectric metal oxide (e.g., $HfO_2$), a dielectric metal nitride, or a dielectric metal oxynitride. The fin-defining material layer 62L is deposited as a conformal layer, i.e., a layer having the same thickness at horizontal portions and at vertical portions. The fin-defining material layer 62L can be deposited, for example, by low pressure chemical vapor deposition (LPCVD) or atomic layer deposition (ALD).

Referring to FIG. 4, the fin-defining material layer 62L is anisotropically etched, for example, by a reactive ion etch (RIE), to form a plurality of fin-defining spacers 62. Specifically, the horizontal portions of the fin-defining material layer 62L are etched through in an anisotropic etch until the top surfaces of the first dielectric layer 40L and the upper dielectric pad portion 50P are physically exposed. The remaining vertical portions of the fin-defining material layer 62L after the anisotropic etch constitute the plurality of fin-defining spacers 62. The fin-defining spacers 62 have the same width throughout.

The anisotropic etch is extended for a time period after complete removal of the horizontal portions of the fin-defining material layer 62L so that topmost portions of the fin-defining spacers 62 are vertically recessed from top surfaces of the mandrel structures 60 upon formation of the fin-defining spacers 62. Each of the fin-defining spacers 62 can be formed as a structure that laterally surrounds one of the mandrel structures 60 and having a uniform thickness at bottom portions thereof, i.e., at portions having vertical sidewalls. The thickness of each bottom portion of the fin-defining spacers 62 having parallel vertical sidewalls can be from 1 nm to 50 nm, although lesser and greater thicknesses can also be employed.

In one embodiment, the plurality of mandrel structures 60 can be a periodic one-dimensional array of periodic structures having a pitch, and the width of each portion of the fin-defining spacers 62 can be the same as one half of the pitch less the width of a mandrel structure 60. As used herein, a "pitch" is the minimum lateral dimension at which a pattern in a periodic structure is repeated. In this case, portions of the fin-defining spacers 62 having vertical sidewalls that are perpendicular to the horizontal direction of the pitch of the one-dimensional array of the plurality of mandrel structures 60 (i.e., the portions of the fin-defining spacers 62 illustrated in FIG. 4) can constitute a one-dimensional array having a pitch that is the same as one half of the pitch of the of the one-dimensional array of the plurality of mandrel structures 60.

In one embodiment, each of the plurality of mandrel structures 60 can have a shape of a rectangular parallelepiped, and each of the plurality of fin-defining spacers 62 can have a cross-sectional shape of a rectangular ring, i.e., a three-dimensional object having a same horizontal cross-sectional area throughout such that the shape of the horizontal cross-sectional area is an area of a larger rectangle less an area of a smaller rectangle that has the same geometrical center as the larger rectangle.

Referring to FIG. 5, a mask material is deposited employing a directional deposition method in which the mask material impinges at the surfaces of the plurality of mandrel structures 60 and the dielectric fin cap layer 40L at a non-zero angle to the surface normal of the top surface of the dielectric fin cap layer 40L. In one embodiment, the direction of the path of the mask material can be within a vertical plane (e.g., within the vertical plane of the vertical cross-sectional view of FIG. 5) that is perpendicular to the parallel vertical sidewalls of the plurality of mandrel structures 60.

The mask material can be a metallic material, a semiconductor material, or a dielectric material. The mask material is different from the materials of the plurality of mandrel structures 60, the fin-defining spacers 62, and the dielectric fin cap layer 40L. In one embodiment, the mask material can be a metal such as copper, aluminum, and tungsten, or a metallic compound material such as tungsten nitride, titanium nitride, tantalum nitride, tungsten carbide, titanium carbide, and tantalum carbide, or a semiconductor material such as germanium, silicon, and a silicon germanium alloy, or a dielectric material such as silicon oxide, silicon nitride, a dielectric metal oxide, and amorphous carbon. The angled deposition can be performed, for example, by physical vapor deposition or vacuum evaporation.

Mask material portions 70 are formed on first fin-defining spacer portions 62A located on a first-side sidewall of each mandrel structure 60 by the directional deposition of the mask material. The mandrel structures 60 shield second fin-defining spacer portions 62B located on a second-side sidewall of each mandrel structure 60 from the mask material during the directional deposition. In addition, at least one mask material layer 70L having the same composition as the mask material portions 70 can be formed on the top surface of the dielectric fin cap layer 40L. The thickness of the mask material portions 70, as measured above a top surface of the mandrel structures 60, can be from 1 nm to 30 nm, although lesser and greater thicknesses can also be employed.

The angle between the direction of the path of the mask material and the surface normal to the dielectric fin cap layer 40L is selected such that the mask material is not deposited on the portion of the fin-defining spacer 62 in contact with the vertical sidewall of each mandrel structure 60 and having an outward-pointing surface normal vector that points away from the source of the mask material. The angle between the direction of the path of the mask material and a downward-pointing surface normal to the dielectric fin cap layer 40L can be from 5 degrees to 60 degrees, although lesser and greater angles can also be employed.

The directional deposition can be performed along a beam direction at a non-zero angle relative to a surface normal of the dielectric fin cap layer 40L, which is a dielectric layer. In one embodiment, the non-zero angle can be selected such that at least one of the mask material portions 70 does not extend to the top surface of the dielectric fin cap layer 40L. In one embodiment, the plurality of mandrel structures 60 can have parallel vertical sidewalls, and the beam direction can be within a two-dimensional plane including the surface normal of the dielectric fin cap layer 40L and a surface normal of the parallel vertical sidewalls of the plurality of mandrel structures 60.

Figure 6:
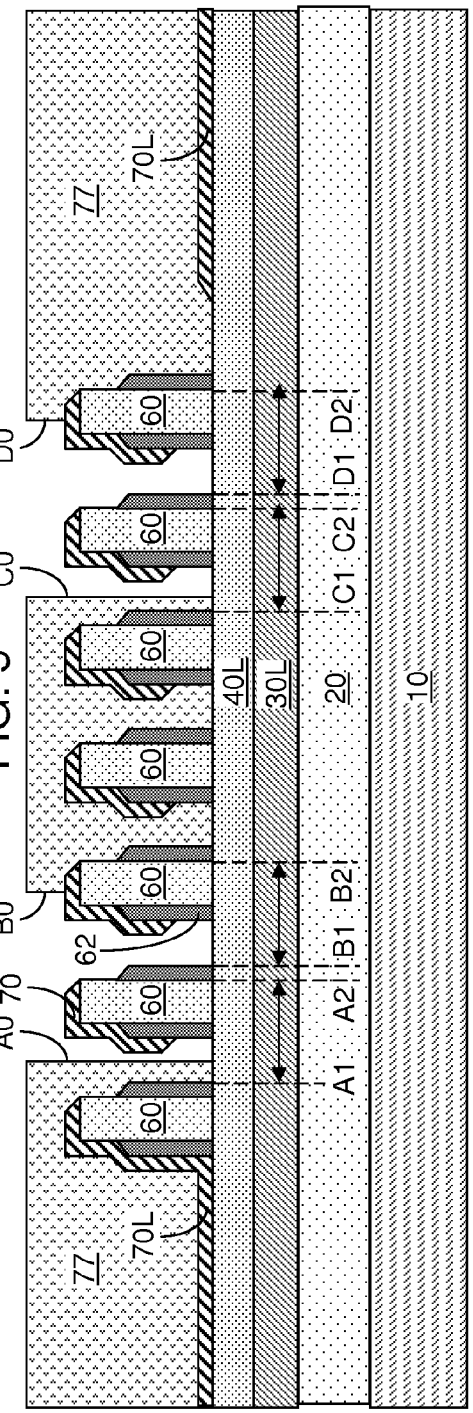
FIG. 6 is a vertical cross-sectional view of the first exemplary semiconductor structure after formation of a patterned mask layer according to the first embodiment of the present disclosure.

Referring to FIG. 6, a patterned mask layer 77 is formed over the plurality of mandrel structures 60, the fin-defining spacers 62, and the mask material portions 70. In one embodiment, the patterned mask layer 77 can be a photoresist layer that is lithographically patterned to form at least one opening therein. The at least one opening within the patterned mask layer 77 can be selected to include an area in which formation of a semiconductor fin is not desired, i.e., to include an area within which absence of a semiconductor fin is desired.

In one embodiment, each opening in the patterned mask layer 77 can include a pair of vertical sidewalls that are parallel to the vertical sidewalls of the plurality of mandrel structures 60. For example, an opening in the patterned mask layer 77 located on the left side of FIG. 6 includes a first vertical sidewall A0 and a second vertical sidewall B0 that are parallel to each other and are parallel to the vertical sidewalls of the plurality of mandrel structures 60. Another opening in the patterned mask layer 77 located on the right side of FIG. 6 includes a third vertical sidewall C0 and a fourth vertical sidewall D0 that are parallel to each other and are parallel to the vertical sidewalls of the plurality of mandrel structures 60.

The mask material portions 70 protect underlying portions of the fin-defining spacers 62 from an anisotropic etch to be subsequently performed. Thus, the mask material portions 70 increase the overlay tolerance for placement of the various vertical sidewalls (A0, B0, C0, D0). In a comparative exemplary structure in which the mask material portions 70 are not formed, each vertical sidewall of an opening in the patterned mask layer 77 needs to be placed between a vertical sidewall of the portion of the fin-defining spacers 62 that needs to be removed and a most proximate portion of the fin-defining spacers 62 that faces the vertical sidewall. Thus, the spacing between a neighboring pair of portions of the fin-defining spacers 62 is the maximum overlay variation in the comparative exemplary structure. The mask material portions 70 provide a maximum overlay tolerance that is equal to a lateral distance between a vertical sidewall of the portion of the fin-defining spacers 62 that needs to be removed and a most proximate portion of the fin-defining spacers 62 that is not covered by the mask material portions 70.

For example, the extremum positions for the first vertical sidewall A0 are shown as position A1 and position A2, the extremum positions for the second vertical sidewall B0 are shown as position B1 and position B2, the extremum positions for the third vertical sidewall C0 are shown as position C1 and position C2, and the extremum positions for the fourth vertical sidewall D0 are shown as position D1 and position D2. In an embodiment in which the portions of the fin-defining spacers 62 constitutes a one-dimensional array having a pitch that is one half of the pitch of the one-dimensional array of the plurality of mandrel structures 60, the overlay tolerance for placement of the various sidewalls of the at least one opening in the patterned mask layer 77 can be the same as the pitch of the one-dimensional array of the plurality of mandrel structures 60 less the width of a portion of the fin-defining spacers 62, which is the same as twice the pitch of the one-dimensional array of the portions of the fin-defining spacers 62 less the width of a portion of the fin-defining spacers 62.

Figure 7:
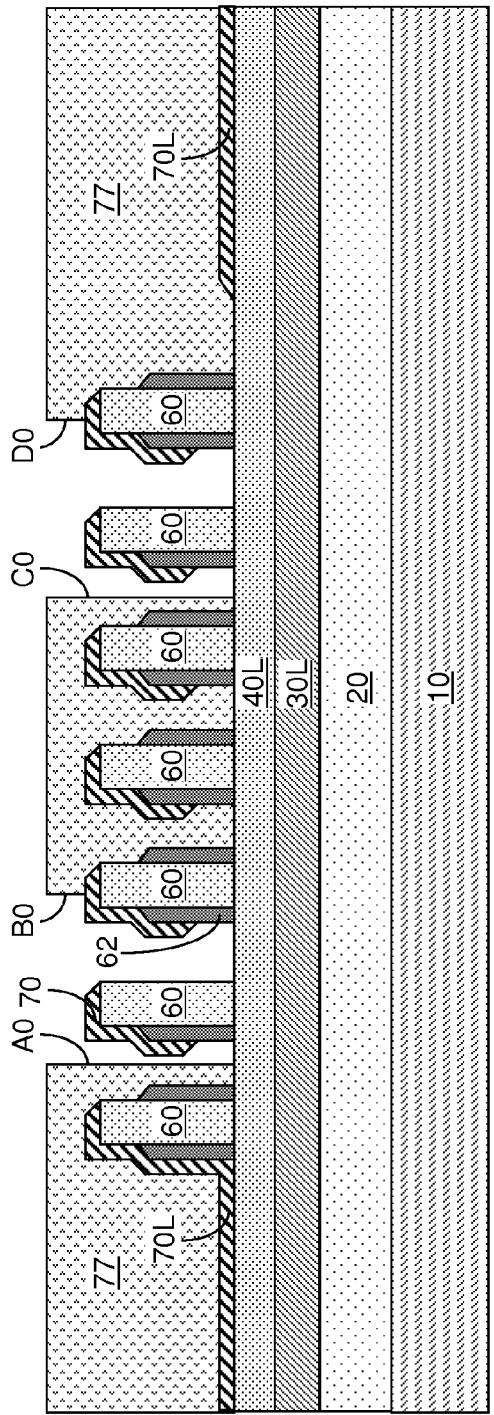
FIG. 7 is a vertical cross-sectional view of the first exemplary semiconductor structure after removal of physically exposed fin-defining spacers by an anisotropic etch according to the first embodiment of the present disclosure.

Referring to FIG. 7, physically exposed fin-defining spacers 62 are removed by an anisotropic etch within each of the at least one opening in the patterned mask layer 77. Portions of the fin-defining spacers 62 located within the at least one opening and not covered by the mask material portions 70 are removed in an anisotropic etch, while a subset of the mask material portions 70 within the at least one opening protects underlying portions of the fin-defining spacers 62 during the anisotropic etch.

The chemistry of the anisotropic etch is selected such that the material of the fin-defining spacers 62 is etched during the anisotropic etch without substantially etching the mask material portions 70. Etch chemistries known in the art can be employed to anisotropically etch the material of the fin-defining spacers 62, while not etching the material of the mask material portions 70.

Figure 8:
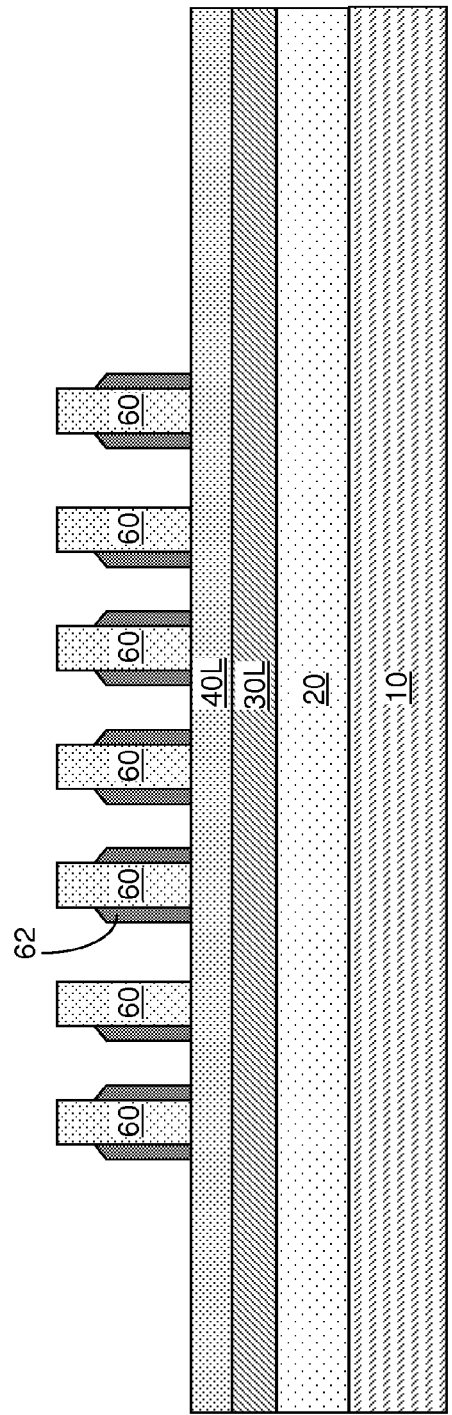
FIG. 8 is a vertical cross-sectional view of the first exemplary semiconductor structure after removal of the patterned mask layer and the mask material portions according to the first embodiment of the present disclosure.

Referring to FIG. 8, the patterned mask layer 77 and the mask material portions 70 are removed selective to the remaining portions of the fin-defining spacers 62. If the patterned mask layer 77 is a photoresist layer, the patterned mask layer 77 can be removed by ashing. The mask material portions 70 are then removed selective to the fin-defining spacers. In one embodiment, if the mask material portions 70 includes a metallic material, the mask material portions 70 can be removed by a wet etch that removes the metallic material selective to the material of the dielectric fin cap layer 40L.

Referring to FIG. 9, the mandrel structures 60 are removed selective to the remaining portions of the fin-defining spacers 62. For example, if the plurality of mandrel structures 60 includes a semiconductor material, the plurality of mandrel structures 60 can be removed by a wet etch that removes the semiconductor material while not removing the dielectric material of the plurality of fin-defining spacers 62. In an embodiment, the portions of the fin-defining spacers 62 can constitute a one-dimensional array prior to the processing step of FIG. 7, a vacancy 62X of a fin-defining spacer can be present at locations from which a portion of a fin-defining spacer 62 is removed at the processing step of FIG. 7.

Figure 10A:
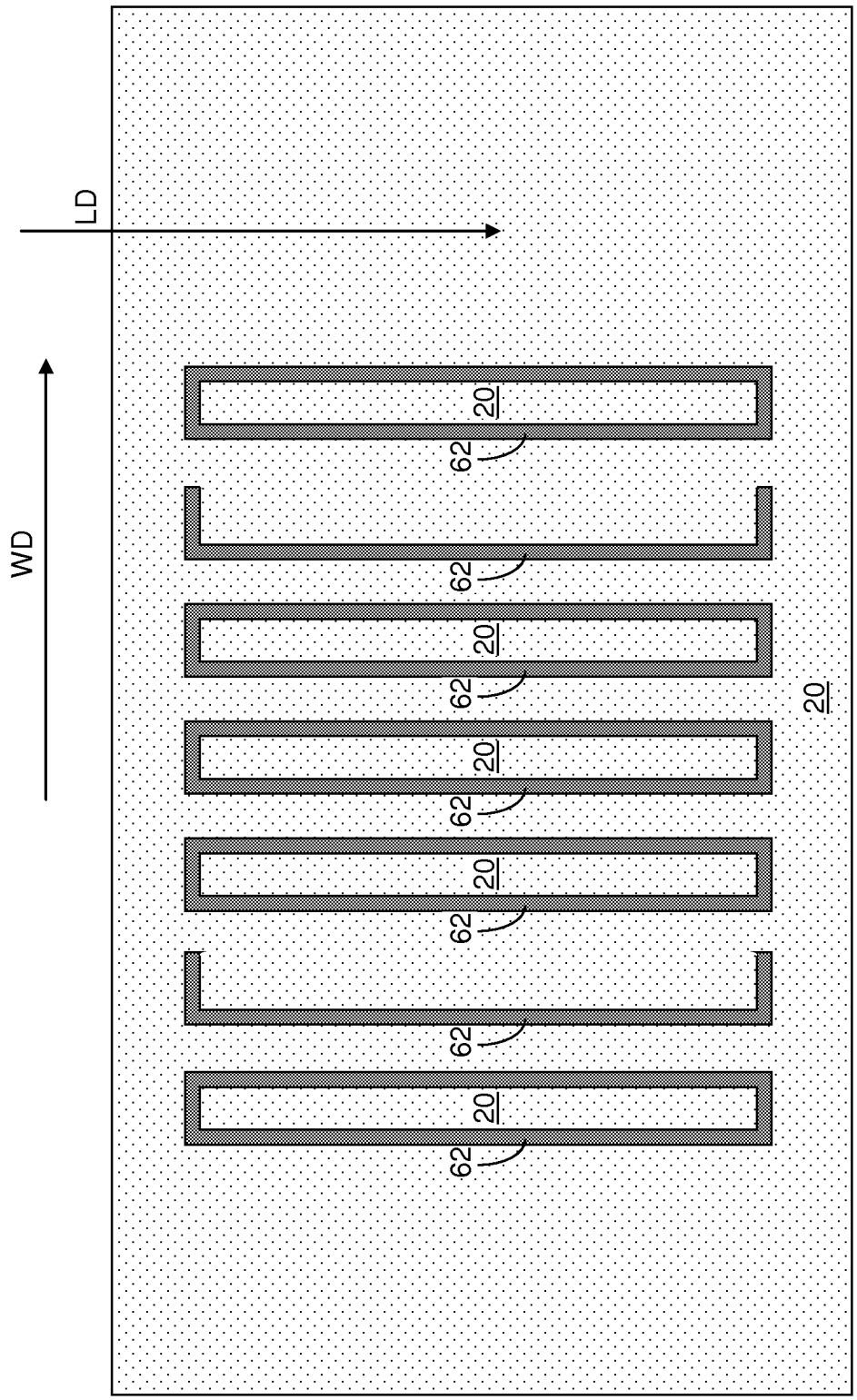
FIG. 10A is a top-down view of the first exemplary semiconductor structure of FIG. 10.

Referring to FIGS. 10 and 10A, the stack of the semiconductor layer 30 and the dielectric fin cap layer 40L is etched in a second anisotropic etch employing remaining portions of the fin-defining spacers 62 as an etch mask. The pattern in the plurality of fin-defining spacers 62 is transferred through the stack of the dielectric fin cap layer 40L and the top semiconductor layer 30L by an anisotropic etch that etches physically exposed portions of the dielectric fin cap layer 40L and the top semiconductor layer 30L. The dielectric fin cap layer 40L and the top semiconductor layer 30L are etched employing the plurality of fin-defining spacers 62 as an etch mask.

Vertical stacks 90, from bottom to top, of a semiconductor fin 30, a dielectric fin 40, and a fin-defining spacer 62 are formed on the top surface of the buried insulator layer 20. Each dielectric fin 40 is a remaining portion of the dielectric fin cap layer 40L. Each semiconductor fin 30 is a remaining portion of the top semiconductor layer 30L. In other words, patterned portions of the top semiconductor layer 30L constitute the plurality of semiconductor fins 30. Within each vertical stack (30, 40, 62), the semiconductor fin 30, the dielectric fin 40, and the fin-defining spacer 62 can have the same horizontal cross-sectional area, which is the same as the horizontal cross-sectional area of a lower portion of the fin-defining spacer 62. Vertical stacks of a semiconductor fin 30 and a dielectric fin 40 can be formed by the second anisotropic etch underneath each remaining portions of the fin-defining spacers 62. In one embodiment, the buried insulator layer 20 can be employed as an etch stop layer for the anisotropic etch that forms the vertical stacks. Each vertical stack (30, 40, 62) can extend over a greater lateral dimension along a lengthwise direction LD than along a widthwise direction WD.

In one embodiment, all of the fin-defining spacers 62 can be consumed during the anisotropic etch that transfers the pattern of the fin-defining spacers 62. In this case, the fin-defining spacers 62 may not be present over each vertical stack of a semiconductor fin 30 and a dielectric fin 40.

In an embodiment, the portions of the fin-defining spacers 62 can constitute a one-dimensional array prior to the processing step of FIG. 7, a vacancy 90X of a vertical stack of a semiconductor fin, a dielectric fin, and a fin-defining spacer can be present at locations from which a portion of a fin-defining spacer 62 is removed at the processing step of FIG. 7.

Figure 11:
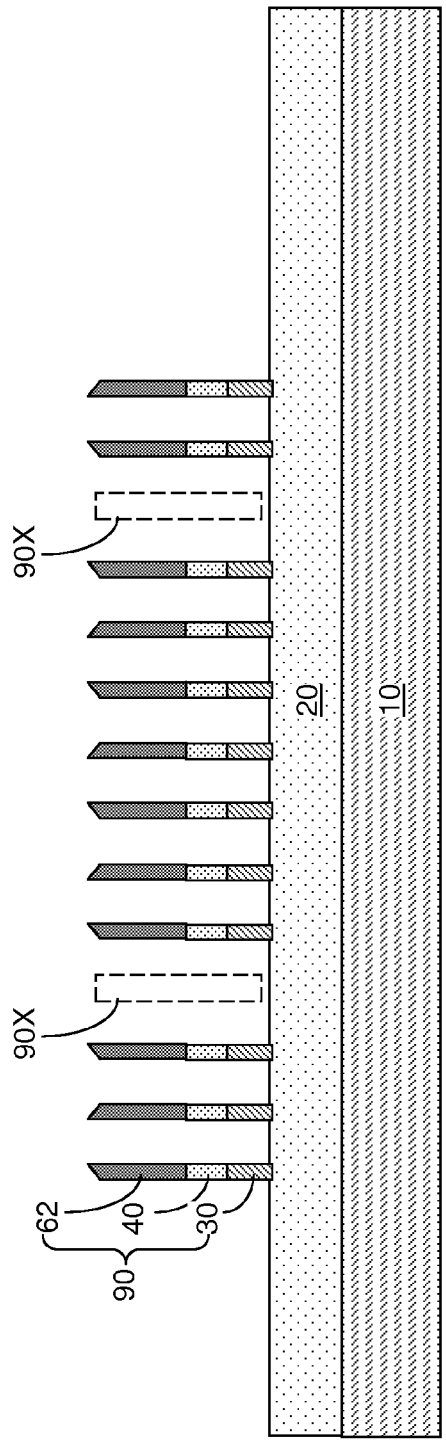
FIG. 11 is a vertical cross-sectional view of the first exemplary semiconductor structure after removing end portions of the vertical stacks of a semiconductor fin, a dielectric fin cap, and a fin-defining spacer according to the first embodiment of the present disclosure.
Figure 11A:
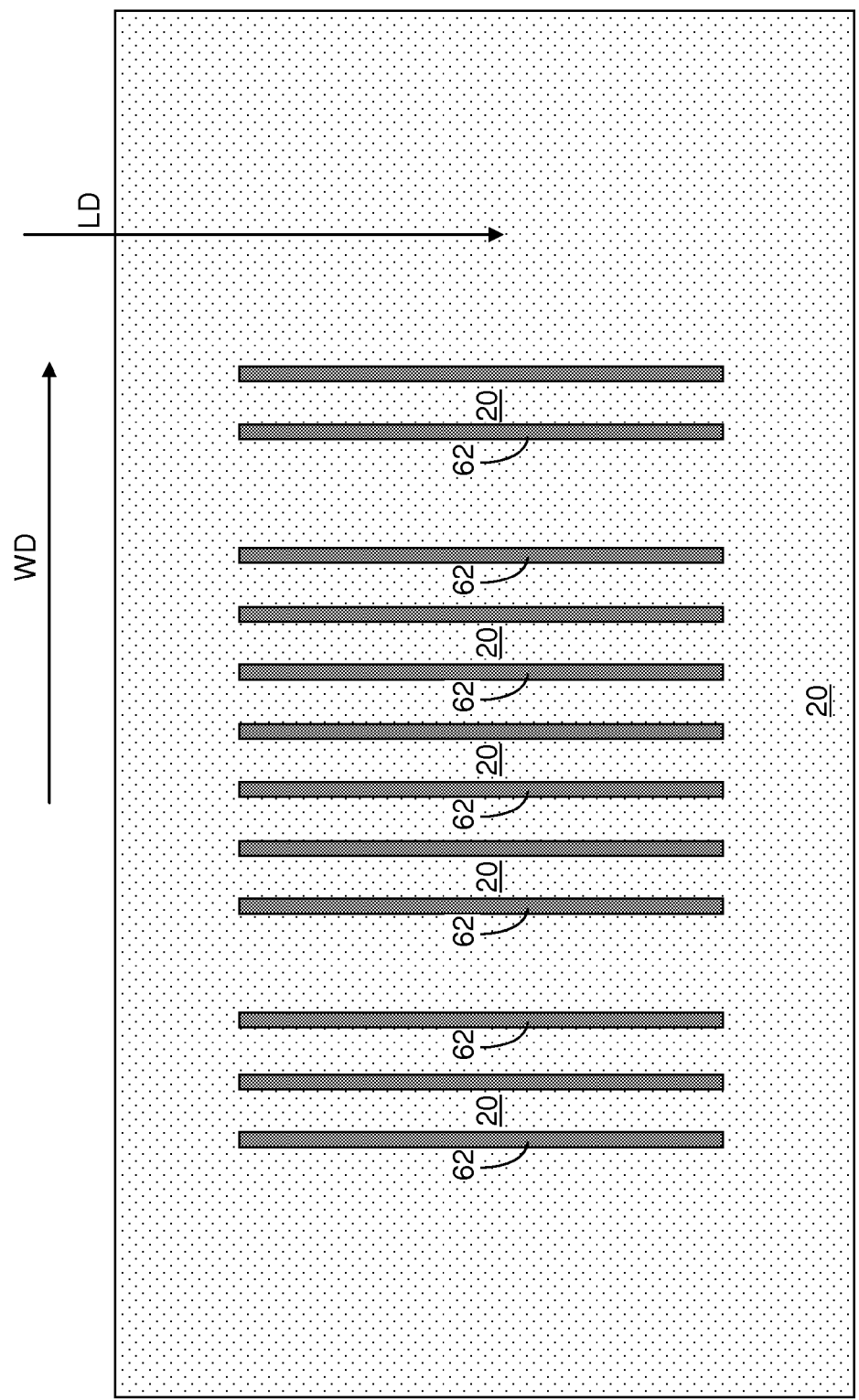
FIG. 11A is a top-down view of the exemplary structure of FIG. 11.

Referring to FIGS. 11 and 11A, end portions of each vertical stack of a semiconductor fin 30, a dielectric fin cap 40, and a fin-defining spacer 62 can be removed, for example, by forming a patterned mask layer (not shown) such as a patterned photoresist layer over center portions of the vertical stacks (30, 40, 62), while physically exposing end portions of the vertical stacks (30, 40, 62), and subsequently removing the physically exposed end portions of the vertical stacks (30, 40, 62) by an etch, which can include a wet etch and/or a dry etch. The patterned mask layer can be subsequently removed.

Figure 12:
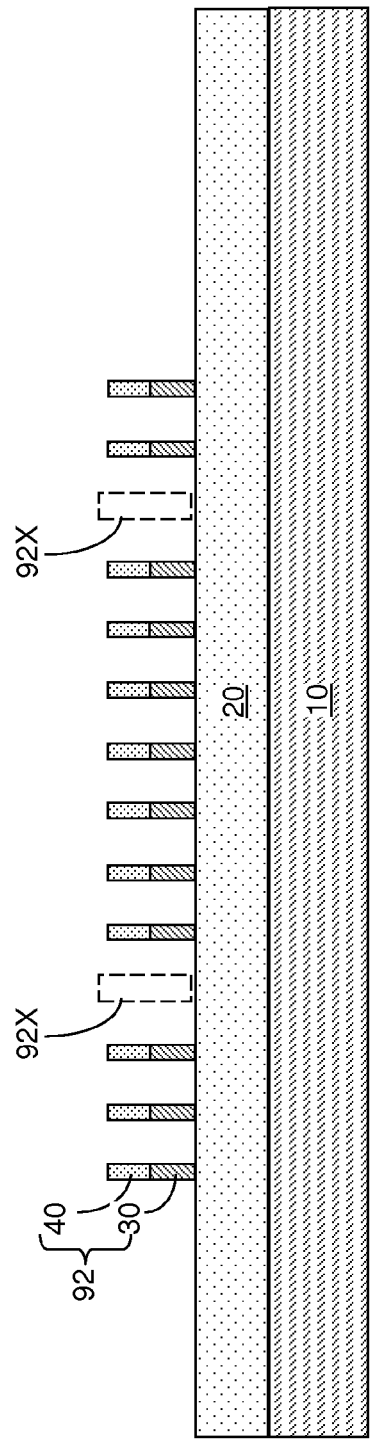
FIG. 12 is a vertical cross-sectional view of the exemplary semiconductor structure after removal of the fin-defining spacers according to the first embodiment of the present disclosure.

Referring to FIG. 12, the fin-defining spacers 62 can be removed selective to the vertical stacks 92 of a semiconductor fin 30 and a dielectric fin 40 employing etch chemistries known in the art. In an embodiment, the portions of the fin-defining spacers 62 can constitute a one-dimensional array prior to the processing step of FIG. 7, a vacancy 92X of a vertical stack of a semiconductor fin and a dielectric fin can be present at locations from which a portion of a fin-defining spacer 62 is removed at the processing step of FIG. 7.

Referring to FIG. 13, a variation of the first exemplary semiconductor structure can be derived from the first exemplary semiconductor structure of FIG. 8 by forming second mask material portions 80. The second mask material portions 80 can be formed by performing a processing step in which the direction of a directional deposition is changed from the processing step of FIG. 5. Specifically, a second mask material is deposited employing a directional deposition method in which the mask material impinges at the surfaces of the plurality of mandrel structures 60 and the dielectric fin cap layer 40L at a non-zero angle to the surface normal of the top surface of the dielectric fin cap layer 40L that is tilted in the opposite direction of the direction of deposition in the processing step of FIG. 5 relative to the surface normal of the dielectric fin cap layer 40L. In one embodiment, the direction of the path of the mask material can be within a vertical plane (e.g., within the vertical plane of the vertical cross-sectional view of FIG. 5) that is perpendicular to the parallel vertical sidewalls of the plurality of mandrel structures 60. The second mask material can be any material that can be employed for the mask material in the processing step of FIG. 5.

Second mask material portions 70 are formed on second fin-defining spacer portions 62B located on a second-side sidewall of each mandrel structure 60 by the directional deposition of the second mask material. The mandrel structures 60 shield first fin-defining spacer portions 62A located on a first-side sidewall of each mandrel structure 60 from the mask material during the directional deposition. In addition, at least one second mask material layer 80L having the same composition as the second mask material portions 80 can be formed on the top surface of the dielectric fin cap layer 40L. The thickness of the second mask material portions 80, as measured above a top surface of the mandrel structures 60, can be from 1 nm to 30 nm, although lesser and greater thicknesses can also be employed.

The angle between the direction of the path of the mask material and the surface normal to the dielectric fin cap layer 40L is selected such that the mask material is not deposited on the portion of the fin-defining spacer 62 in contact with the vertical sidewall of each mandrel structure 60 and having an outward-pointing surface normal vector that points away from the source of the second mask material. The angle between the direction of the path of the second mask material and the surface normal to the dielectric fin cap layer 40L can be from 5 degrees to 60 degrees, although lesser and greater angles can also be employed.

The directional deposition can be performed along a beam direction at a non-zero angle relative to a surface normal of the dielectric fin cap layer 40L. In one embodiment, the non-zero angle can be selected such that at least one of the second mask material portions 80 does not extend to the top surface of the dielectric fin cap layer 40L. In one embodiment, the plurality of mandrel structures 60 can have parallel vertical sidewalls, and the beam direction can be within a two-dimensional plane including the surface normal of the dielectric fin cap layer 40L and a surface normal of the parallel vertical sidewalls.

Referring to FIG. 14, a second patterned mask layer 87 including at least one opening therein is formed. The processing step of FIG. 7 is performed to remove physically exposed portions of the fin-defining spacers 62 from within each of the at least one opening in the second patterned mask layer 87.

Referring to FIG. 15, the processing steps of FIGS. 8 and 9 are formed to remove the second patterned mask layer 87 and the second mask material portions 80.

Referring to FIG. 16, the processing steps of FIGS. 10, 10A, 11, 11A, and 12 are performed to form vertical stacks 92 of a semiconductor fin 30 and a fin cap dielectric 40. In an embodiment, the portions of the fin-defining spacers 62 can constitute a one-dimensional array prior to the processing step of FIG. 7, a vacancy 92X of a vertical stack of a semiconductor fin and a dielectric fin can be present at locations from which a portion of a fin-defining spacer 62 is removed at the processing steps of FIGS. 7 and 15.

Figure 17:
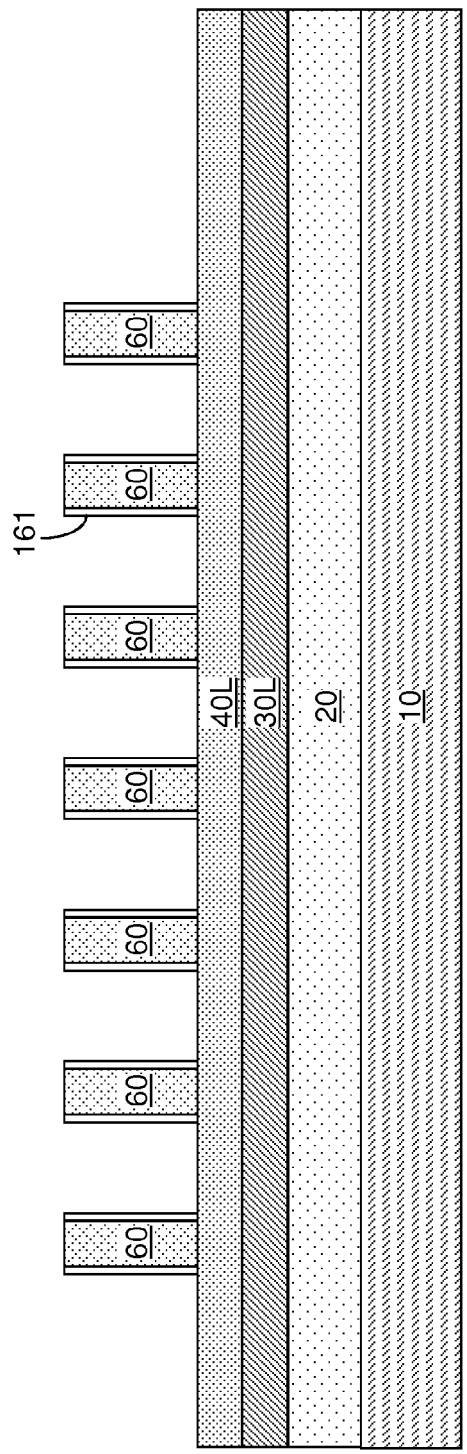
FIG. 17 is a vertical cross-sectional view of a second exemplary structure after formation of mandrel structures and an optional spacer according to a second embodiment of the present disclosure.

Referring to FIG. 17, a second exemplary structure according to a second embodiment of the present disclosure can be derived from the first exemplary structure of FIG. 2. An optional spacer 161 can be formed on sidewalls of each mandrel structure 60, for example, by deposition of a conformal material layer and an anisotropic etch that removes the horizontal portions of the conformal material layer. The remaining vertical portions of the conformal material layer can constitute the optional spacer 161. In one embodiment, the optional spacer 161 can include silicon oxide. The thickness of the optional spacer 161 can be from 0.6 nm to 3 nm, although lesser and greater thicknesses can also be employed.

Figure 18:
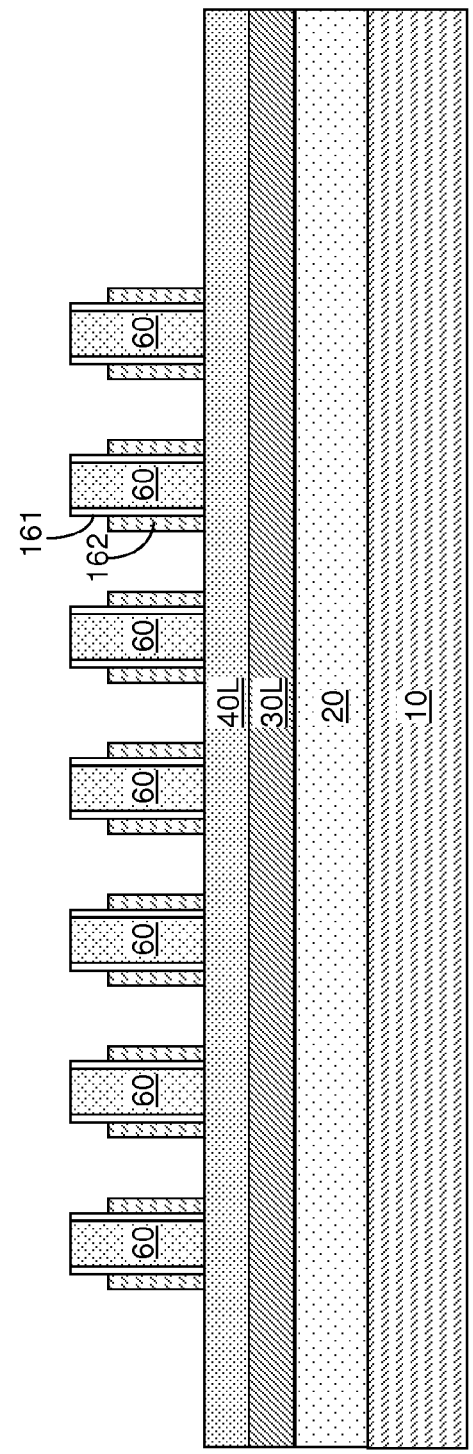
FIG. 18 is a vertical cross-sectional view of the second exemplary structure after formation of fin-defining spacers according to the second embodiment of the present disclosure.

Referring to FIG. 18, fin-defining spacers 162 are formed on the sidewalls of the mandrel structures 60. In one embodiment, the fin-defining spacers 162 can be formed employing the processing steps of FIGS. 3 and 4. For example, a fin-defining material layer can be deposited, and an anisotropic etch can be performed to remove horizontal portions of the fin-defining material layer. The remaining vertical portions of the fin-defining material layer constitute the fin-defining spacers 162. The fin-defining spacers 162 can include a semiconductor material such as amorphous silicon, polysilicon, amorphous or polycrystalline germanium, an amorphous or polycrystalline alloy of silicon and germanium, amorphous carbon, or a dielectric material such as silicon nitride, a dielectric metal oxide (e.g., $HfO_2$), a dielectric metal nitride, or a dielectric metal oxynitride. The thickness of each bottom portion of the fin-defining spacers 162 having parallel vertical sidewalls can be from 1 nm to 50 nm, although lesser and greater thicknesses can also be employed.

The anisotropic etch employed to form the fin-defining spacers 162 can be extended for a time period after complete removal of the horizontal portions of the fin-defining material layer so that topmost portions of the fin-defining spacers 162 are vertically recessed from top surfaces of the mandrel structures 60 upon formation of the fin-defining spacers 162. Each of the fin-defining spacers 162 can be formed as a structure that laterally surrounds one of the mandrel structures 60 and having a uniform thickness at bottom portions thereof, i.e., at portions having vertical sidewalls.

In one embodiment, the plurality of mandrel structures 60 can be a periodic one-dimensional array of periodic structures having a pitch, and the width of each portion of the fin-defining spacers 162 can be the same as one half of the pitch less the width of a mandrel structure 60. In this case, portions of the fin-defining spacers 162 having vertical sidewalls that are perpendicular to the horizontal direction of the pitch of the one-dimensional array of the plurality of mandrel structures 60 (i.e., the portions of the fin-defining spacers 162 illustrated in FIG. 18) can constitute a one-dimensional array having a pitch that is the same as one half of the pitch of the of the one-dimensional array of the plurality of mandrel structures 60.

In one embodiment, each of the plurality of mandrel structures 60 can have a shape of a rectangular parallelepiped, and each of the plurality of fin-defining spacers 162 can have a cross-sectional shape of a rectangular ring, i.e., a three-dimensional object having a same horizontal cross-sectional area throughout such that the shape of the horizontal cross-sectional are is an area of a larger rectangle less an area of a smaller rectangle that has the same geometrical center as the larger rectangle.

Figure 19:
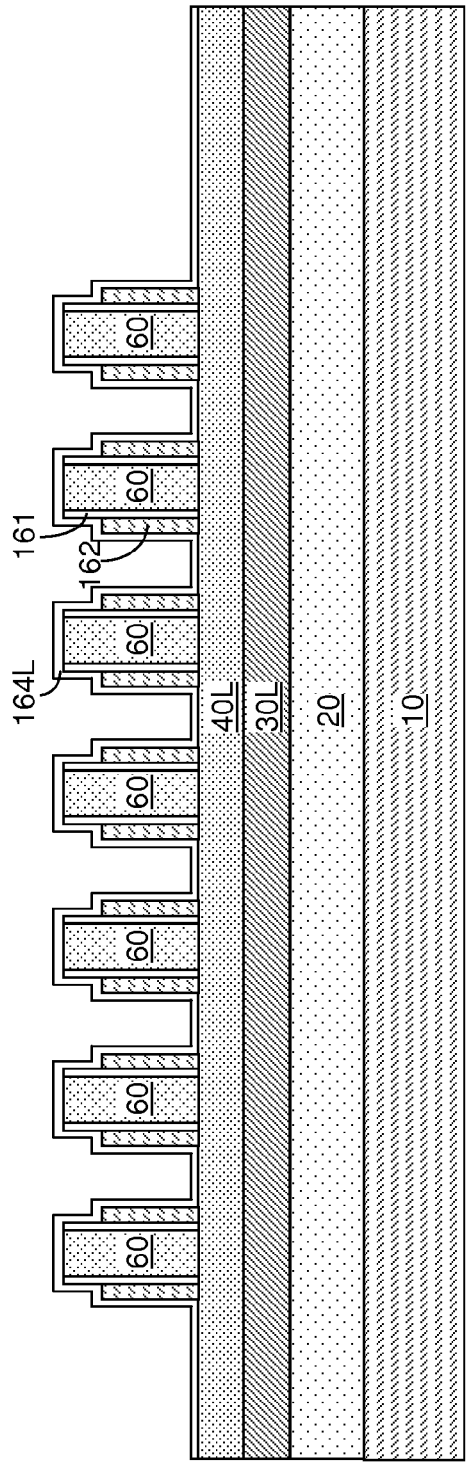
FIG. 19 is a vertical cross-sectional view of the second exemplary structure after formation of a contiguous oxide layer according to the second embodiment of the present disclosure.

Referring to FIG. 19, a contiguous oxide layer 164L is formed conformally on physically exposed surfaces of the plurality of mandrel structures 60, the fin-defining spacers 162, and the dielectric fin cap layer 40L. The contiguous oxide layer 164 includes silicon oxide, and can be formed, for example, by chemical vapor deposition (CVD). The thickness of the contiguous oxide layer 164L can be substantially the same throughout the entirety thereof, and can be from 1 nm to 20 nm, although lesser and greater thicknesses can also be employed.

Figure 20:
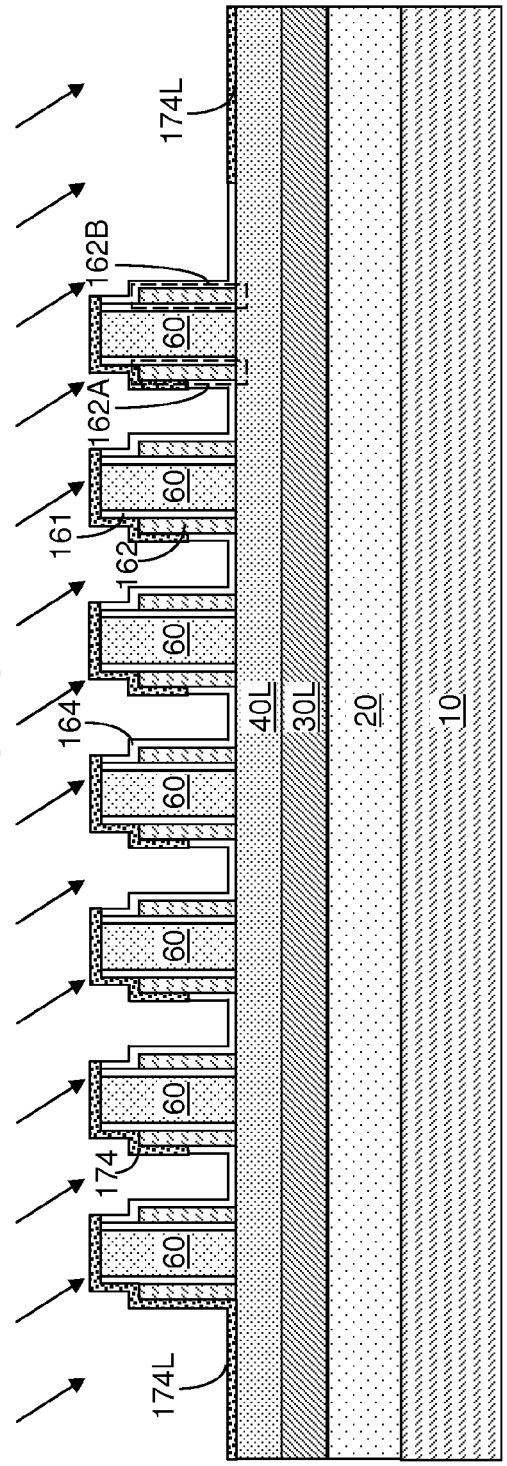
FIG. 20 is a vertical cross-sectional view of the second exemplary structure after formation of structurally-damaged oxide portions according to the second embodiment of the present disclosure.

Referring to FIG. 20, structurally-damaged oxide portions 174 are formed by angled ion implantation of ions into or through portions of the contiguous oxide layer 164L. The ions impinge at the surfaces of the portions of the contiguous oxide layer 164L at a non-zero angle to the surface normal of the top surface of the dielectric fin cap layer 40L. In one embodiment, the direction of the path of the implanted ions can be within a vertical plane (e.g., within the vertical plane of the vertical cross-sectional view of FIG. 20) that is perpendicular to the parallel vertical sidewalls of the plurality of mandrel structures 60.

In one embodiment, the implanted ions can have atomic mass greater than the atomic mass of silicon. In one embodiment, the implanted ions can be an inert atom heavier than Si such as Ar, Kr, and Xe. The implanted ions cause structural damage to the silicon oxide material within the implanted portions of the contiguous oxide layer 164L and to convert the implanted portions of the contiguous oxide layer 164L into structurally-damaged oxide portions 174. The structural damage in the structurally-damaged oxide portions 174 includes breakage of some of the bonds between silicon atoms and oxygen atoms due to the energy that the implanted ions impart to the silicon oxide material in the structurally-damaged oxide portions 174. The portions of the contiguous oxide layer 164L that are not implanted with the ion (and thus, are not structurally damaged) are herein referred to oxide material portions 164.

The structurally-damaged oxide portions 174 are formed on first fin-defining spacer portions 162A located on a first-side sidewall of each mandrel structure 60 by the angled ion implantation. The mandrel structures 60 shield second fin-defining spacer portions 162B located on a second-side sidewall of each mandrel structure 60 from the ions during the angled ion implantation. In addition, at least one structurally-damaged oxide layer 174L having the same composition as the structurally-damaged oxide portions 174 can be formed on the top surface of the dielectric fin cap layer 40L.

The angle between the direction of the ion beam during the ion implantation and the surface normal to the dielectric fin cap layer 40L is selected such that the ions do not impinge on the portion of the fin-defining spacer 62 in contact with the vertical sidewall of each mandrel structure 60 and having an outward-pointing surface normal vector that points away from the source of the ions during the ion implantation. The angle between the direction of the ion beam and a downward-pointing surface normal to the dielectric fin cap layer 40L can be from 5 degrees to 60 degrees, although lesser and greater angles can also be employed.

The angled ion implantation can be performed along a beam direction at a non-zero angle relative to a surface normal of the dielectric fin cap layer 40L, which is a dielectric layer. In one embodiment, the non-zero angle can be selected such that at least one of the structurally-damaged oxide portions 174 does not extend to the top surface of the dielectric fin cap layer 40L. In one embodiment, the plurality of mandrel structures 60 can have parallel vertical sidewalls, and the direction of the impinging ions can be within a two-dimensional plane including the surface normal of the dielectric fin cap layer 40L and a surface normal of the parallel vertical sidewalls of the plurality of mandrel structures 60.

Referring to FIG. 21, a patterned mask layer 177 is formed over the plurality of mandrel structures 60, the fin-defining spacers 162, and the structurally-damaged oxide portions 174. In one embodiment, the patterned mask layer 177 can be a photoresist layer that is lithographically patterned to form at least one opening therein. The at least one opening within the patterned mask layer 177 can be selected to include an area in which formation of a semiconductor fin is not desired, i.e., to include an area within which absence of a semiconductor fin is desired.

In one embodiment, each opening in the patterned mask layer 177 can include a pair of vertical sidewalls that are parallel to the vertical sidewalls of the plurality of mandrel structures 60. For example, an opening in the patterned mask layer 177 located on the left side of FIG. 21 includes a first vertical sidewall A0' and a second vertical sidewall B0' that are parallel to each other and are parallel to the vertical sidewalls of the plurality of mandrel structures 60. Another opening in the patterned mask layer 177 located on the right side of FIG. 21 includes a third vertical sidewall C0' and a fourth vertical sidewall D0' that are parallel to each other and are parallel to the vertical sidewalls of the plurality of mandrel structures 60.

The structurally-damaged oxide portions 174 define areas within which the fin-defining spacers 162 are removed in an anisotropic etch to be subsequently performed. The oxide material portions 164, which include undamaged silicon oxide and can consist essentially of silicon oxide, define areas within which any underlying fin-defining spacers 162 are to be protected in the anisotropic etch to be subsequently performed. Thus, the combination of the oxide material portions 164 and the structurally-damaged oxide portions 174 increase the overlay tolerance for placement of the various vertical sidewalls (A0', B0', C0', D0'). In a comparative exemplary structure in which the combination of the oxide material portions 164 and the structurally-damaged oxide portions 174 is not formed, each vertical sidewall of an opening in the patterned mask layer 177 needs to be placed between a vertical sidewall of the portion of the fin-defining spacers 162 that needs to be removed and a most proximate portion of the fin-defining spacers 162 that faces the vertical sidewall. Thus, the spacing between a neighboring pair of portions of the fin-defining spacers 162 is the maximum overlay variation in the comparative exemplary structure. The combination of the oxide material portions 164 and the structurally-damaged oxide portions 174 provides a maximum overlay tolerance that is equal to a lateral distance between a vertical sidewall of the portion of the fin-defining spacers 162 that needs to be removed and a most proximate portion of the fin-defining spacers 162 that is not covered by the structurally-damaged oxide portions 174.

For example, the extremum positions for the first vertical sidewall A0' are shown as position A1' and position A2', the extremum positions for the second vertical sidewall B0' are shown as position B1' and position B2', the extremum positions for the third vertical sidewall C0' are shown as position C1' and position C2', and the extremum positions for the fourth vertical sidewall D0' are shown as position D1' and position D2'. In an embodiment in which the portions of the fin-defining spacers 162 constitutes a one-dimensional array having a pitch that is one half of the pitch of the one-dimensional array of the plurality of mandrel structures 60, the overlay tolerance for placement of the various sidewalls of the at least one opening in the patterned mask layer 177 can be the same as the pitch of the one-dimensional array of the plurality of mandrel structures 60 less the width of a portion of the fin-defining spacers 162, which is the same as twice the pitch of the one-dimensional array of the portions of the fin-defining spacers 162 less the width of a portion of the fin-defining spacers 162.

Referring to FIG. 22, a subset of the structurally-damaged oxide portions 174 is removed from within the at least one opening in the patterned mask layer 177, while the oxide material portions 164, i.e., the unimplanted portions of the contiguous oxide layer, protect underlying portions of the fin-defining spacers 162 within the at least one opening in the patterned mask layer 177. Specifically, physically exposed portions of the structurally-damaged oxide portions 174 are removed selective to the oxide material portions 164 within each opening in the patterned mask layer 177. A wet etch chemistry that etches the physically damaged silicon oxide at a greater etch rate than undamaged silicon oxide can be employed. For example, a wet etch employing hydrofluoric acid can be employed to etch the physically damaged silicon oxide at a greater etch rate than undamaged silicon oxide. In one embodiment, the ratio of the etch rate of the physically damaged silicon oxide in the structurally-damaged oxide portions 174 to the etch rate of the undamaged silicon oxide of the oxide material portions 164 can be from 2 to 10, although a greater ratio can also be employed. The duration of the etch can be selected such that the entirety of the structurally-damaged oxide portions 174 is removed from within each of the at least one opening in the patterned mask layer 177, while the oxide material portions 164 are not completely removed. In one embodiment, the remaining portions of the oxide material portions 164 within each of the at least one opening in the patterned mask layer 177 can have at least 50% of the thickness of the contiguous oxide layer 164L as formed at the processing step of FIG. 19.

Figure 23:
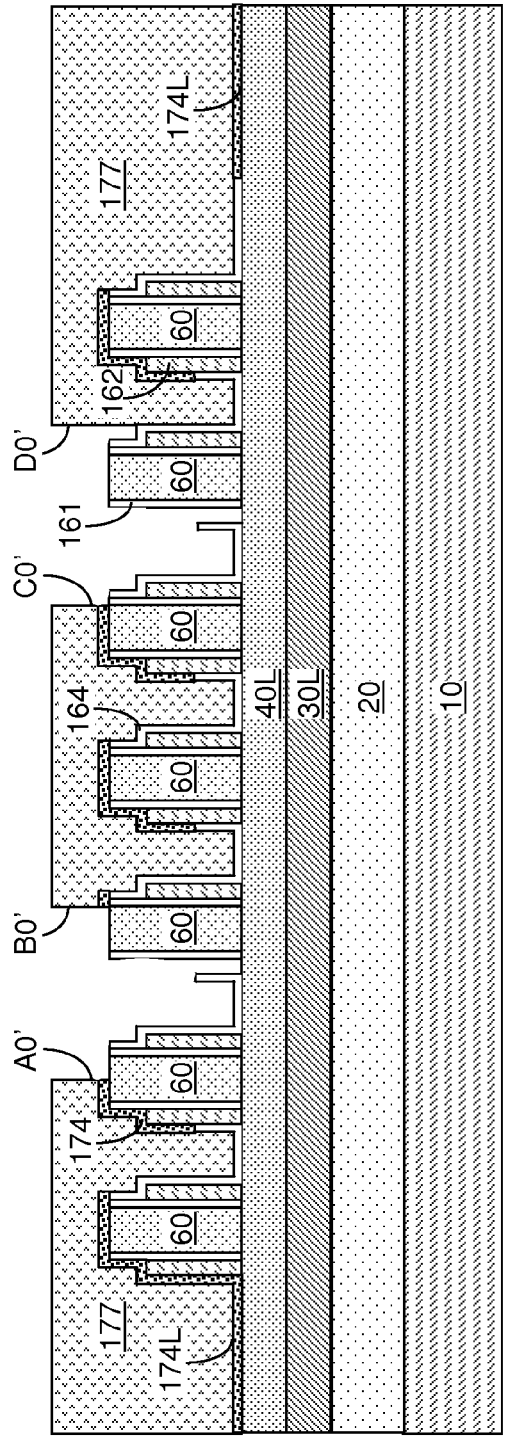
FIG. 23 is a vertical cross-sectional view of the second exemplary structure after removal of physically exposed fin-defining spacers according to the second embodiment of the present disclosure.

Referring to FIG. 23, physically exposed fin-defining spacers 162 are removed from within the at least one opening of the patterned mask layer 177 selective to the oxide material portions 164, i.e., the unimplanted portions of the contiguous oxide layer 164L. Specifically, the physically exposed fin-defining spacers 162 are removed by an anisotropic etch within each of the at least one opening in the patterned mask layer 177, while the oxide material portions 164 protect underlying portions of the fin-defining spacers 162 during the anisotropic etch.

The chemistry of the anisotropic etch is selected such that the material of the fin-defining spacers 162 is etched during the anisotropic etch without substantially etching the oxide material portions 164. Etch chemistries known in the art can be employed to anisotropically etch the material of the fin-defining spacers 162, while not etching the silicon oxide material of the oxide material portions 164.

Figure 24:
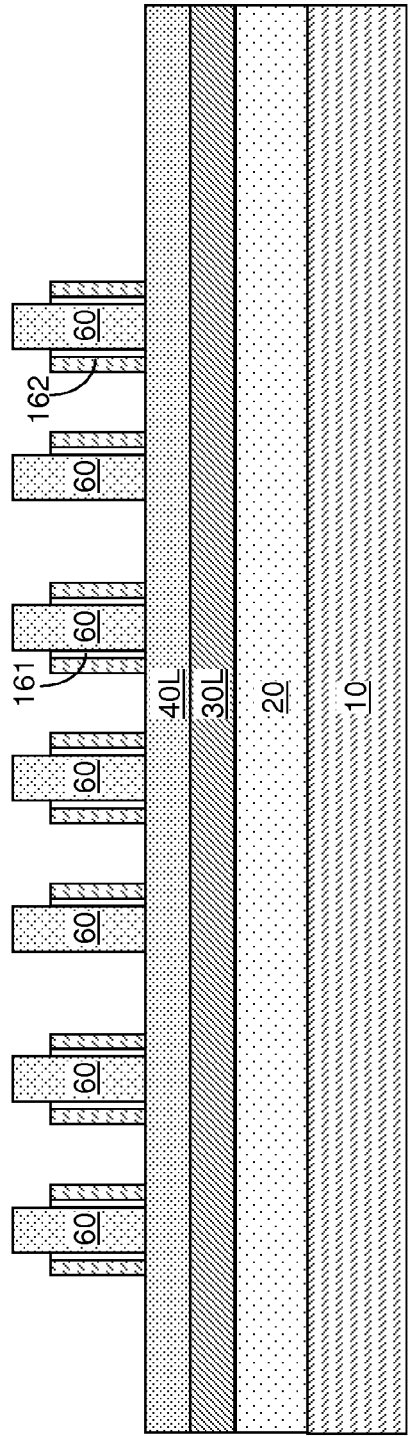
FIG. 24 is a vertical cross-sectional view of the second exemplary structure after removal of the patterned mask layer according to the second embodiment of the present disclosure.

Referring to FIG. 24, the patterned mask layer 177, the oxide material portions 164, and any remaining sub-portions of the structurally-damaged oxide portions 174 are removed selective to the remaining portions of the fin-defining spacers 162. If the patterned mask layer 177 is a photoresist layer, the patterned mask layer 177 can be removed by ashing. The oxide material portions 164 and the structurally-damaged oxide portions 174 are then removed selective to the fin-defining spacers 162. In one embodiment, the dielectric fin cap layer 40L can include silicon oxide or a dielectric metal oxide, and the oxide material portions 164 and the structurally-damaged oxide portions 174 can be removed by a wet etch employing hydrofluoric acid chemistry.

Figure 25:
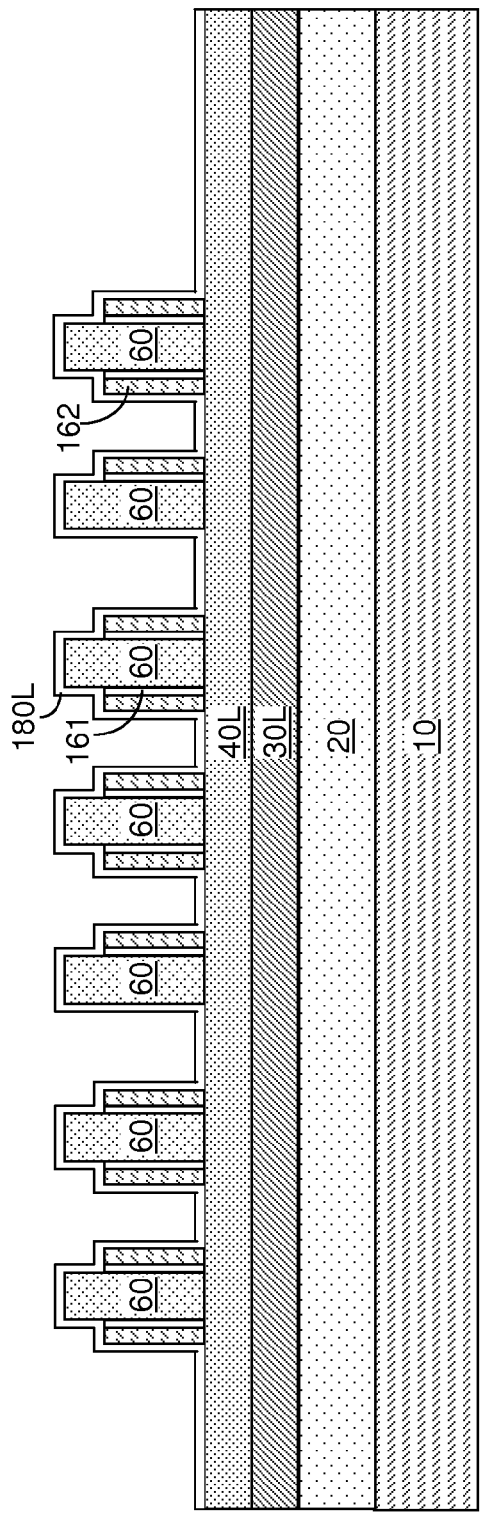
FIG. 25 is a vertical cross-sectional view of the second exemplary structure after formation of a second contiguous oxide layer according to the second embodiment of the present disclosure.

Referring to FIG. 25, a second contiguous oxide layer 180L can be optionally formed conformally on physically exposed surfaces of the plurality of mandrel structures 60, the fin-defining spacers 162, and the dielectric fin cap layer 40L. The second contiguous oxide layer 180L includes silicon oxide, and can be formed, for example, by chemical vapor deposition (CVD). The thickness of the second contiguous oxide layer 180L can be substantially the same throughout the entirety thereof, and can be from 1 nm to 20 nm, although lesser and greater thicknesses can also be employed.

Figure 26:
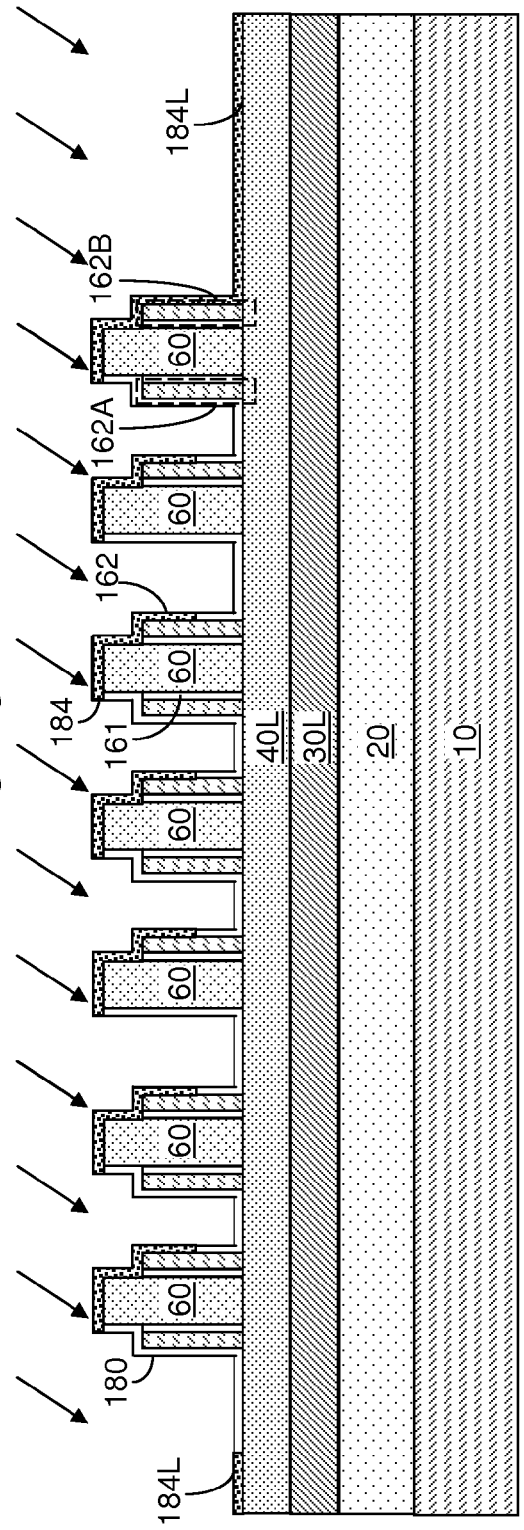
FIG. 26 is a vertical cross-sectional view of the second exemplary structure after formation of second structurally-damaged oxide portions according to the second embodiment of the present disclosure.

Referring to FIG. 26, second structurally-damaged oxide portions 184 are formed by a second angled ion implantation of ions into or through portions of the second contiguous oxide layer 180L. The ions impinge at the surfaces of the portions of the contiguous oxide layer 180L at a non-zero angle to the surface normal of the top surface of the dielectric fin cap layer 40L. The tilt angle of the second angled ion implantation can be toward the opposite side of the tilt angle of the angled ion implantation at the processing step of FIG. 20. In one embodiment, the direction of the path of the implanted ions can be within a vertical plane (e.g., within the vertical plane of the vertical cross-sectional view of FIG. 26) that is perpendicular to the parallel vertical sidewalls of the plurality of mandrel structures 60.

In one embodiment, the implanted ions can have atomic mass greater than the atomic mass of silicon. In one embodiment, the implanted ions can be an inert atom heavier than Si such as Ar, Kr, and Xe. The implanted ions cause structural damage to the silicon oxide material within the implanted portions of the second contiguous oxide layer 180L and to convert the implanted portions of the second contiguous oxide layer 180L into second structurally-damaged oxide portions 184. The structural damage in the second structurally-damaged oxide portions 184 includes breakage of some of the bonds between silicon atoms and oxygen atoms due to the energy that the implanted ions impart to the silicon oxide material in the structurally-damaged oxide portions 184. The portions of the contiguous oxide layer 180L that are not implanted with the ion (and thus, are not structurally damaged) are herein referred to second oxide material portions 180.

The structurally-damaged oxide portions 184 are formed on second fin-defining spacer portions 162B located on a second-side sidewall of each mandrel structure 60 by the angled ion implantation. The mandrel structures 60 shield first fin-defining spacer portions 162A located on a first-side sidewall of each mandrel structure 60 from the ions during the angled ion implantation. In addition, at least one second structurally-damaged oxide layer 184L having the same composition as the second structurally-damaged oxide portions 184 can be formed on the top surface of the dielectric fin cap layer 40L.

The angle between the direction of the ion beam during the ion implantation and the surface normal to the dielectric fin cap layer 40L is selected such that the ions do not impinge on the portion of the fin-defining spacer 62 in contact with the vertical sidewall of each mandrel structure 60 and having an outward-pointing surface normal vector that points away from the source of the ions during the ion implantation. The angle between the direction of the ion beam and a downward-pointing surface normal to the dielectric fin cap layer 40L can be from 5 degrees to 60 degrees, although lesser and greater angles can also be employed.

The angled ion implantation can be performed along a beam direction at a non-zero angle relative to a surface normal of the dielectric fin cap layer 40L. In one embodiment, the non-zero angle can be selected such that at least one of the second structurally-damaged oxide portions 184 does not extend to the top surface of the dielectric fin cap layer 40L. In one embodiment, the plurality of mandrel structures 60 can have parallel vertical sidewalls, and the direction of the impinging ions can be within a two-dimensional plane including the surface normal of the dielectric fin cap layer 40L and a surface normal of the parallel vertical sidewalls of the plurality of mandrel structures 60.

Referring to FIG. 27, a patterned mask layer 187 is formed over the plurality of mandrel structures 60, the fin-defining spacers 162, the second oxide material portions 180, and the second structurally-damaged oxide portions 184. In one embodiment, the patterned mask layer 197 can be a photoresist layer that is lithographically patterned to form at least one opening therein. The at least one opening within the patterned mask layer 187 can be selected to include an area in which formation of a semiconductor fin is not desired, i.e., to include an area within which absence of a semiconductor fin is desired.

Referring to FIG. 28, the processing step of FIG. 22 is performed to remove a subset of the second structurally-damaged oxide portions 184 is removed from within the at least one opening in the patterned mask layer 187, while the second oxide material portions 180, i.e., the unimplanted portions of the second contiguous oxide layer, protect underlying portions of the fin-defining spacers 162 within the at least one opening in the patterned mask layer 187. The processing step of FIG. 23 is then performed so that physically exposed fin-defining spacers 162 are removed from within the at least one opening of the patterned mask layer 187 selective to the second oxide material portions 180, i.e., the unimplanted portions of the second contiguous oxide layer 180L. Subsequently, the processing step if FIG. 24 is performed so that the patterned mask layer 187, the second oxide material portions 180, and any remaining sub-portions of the second structurally-damaged oxide portions 184 are removed selective to the remaining portions of the fin-defining spacers 162.

Referring to FIG. 29, the mandrel structures 60 are removed selective to the remaining portions of the fin-defining spacers 162. For example, if the plurality of mandrel structures 60 includes a semiconductor material, the plurality of mandrel structures 60 can be removed by a wet etch that removes the semiconductor material while not removing the dielectric material of the plurality of fin-defining spacers 162. In an embodiment, the portions of the fin-defining spacers 162 can constitute a one-dimensional array prior to the processing step of FIG. 21, a vacancy of a fin-defining spacer can be present at locations from which a portion of a fin-defining spacer 162 is removed at the processing steps of FIG. 23 or at the processing step of FIG. 28.

Referring to FIG. 30, the stack of the semiconductor layer 30 and the dielectric fin cap layer 40L is etched in a second anisotropic etch employing remaining portions of the fin-defining spacers 162 as an etch mask. The processing steps of FIGS. 10 and 10A can be employed at this step. The pattern in the plurality of fin-defining spacers 62 is transferred through the stack of the dielectric fin cap layer 40L and the top semiconductor layer 30L by an anisotropic etch that etches physically exposed portions of the dielectric fin cap layer 40L and the top semiconductor layer 30L. The dielectric fin cap layer 40L and the top semiconductor layer 30L are etched employing the plurality of fin-defining spacers 62 as an etch mask.

Vertical stacks 190, from bottom to top, of a semiconductor fin 30, a dielectric fin 40, and a fin-defining spacer 162 are formed on the top surface of the buried insulator layer 20. Each dielectric fin 40 is a remaining portion of the dielectric fin cap layer 40L. Each semiconductor fin 30 is a remaining portion of the top semiconductor layer 30L. In other words, patterned portions of the top semiconductor layer 30L constitute the plurality of semiconductor fins 30. Within each vertical stack (30, 40, 162), the semiconductor fin 30, the dielectric fin 40, and the fin-defining spacer 162 can have the same horizontal cross-sectional area, which is the same as the horizontal cross-sectional area of a lower portion of the fin-defining spacer 162. Vertical stacks of a semiconductor fin 30 and a dielectric fin 40 can be formed by the second anisotropic etch underneath each remaining portions of the fin-defining spacers 162. In one embodiment, the buried insulator layer 20 can be employed as an etch stop layer for the anisotropic etch that forms the vertical stacks. Each vertical stack (30, 40, 162) can extend over a greater lateral dimension along a lengthwise direction LD than along a widthwise direction WD as illustrated in FIG. 10A.

In one embodiment, all of the fin-defining spacers 162 can be consumed during the anisotropic etch that transfers the pattern of the fin-defining spacers 162. In this case, the fin-defining spacers 62 may not be present over each vertical stack of a semiconductor fin 30 and a dielectric fin 40.

In an embodiment, the portions of the fin-defining spacers 62 can constitute a one-dimensional array prior to the processing step of FIG. 21, a vacancy 190X of a vertical stack of a semiconductor fin, a dielectric fin, and a fin-defining spacer can be present at locations from which a portion of a fin-defining spacer 162 is removed at the processing step of FIG. 23 or at the processing step of FIG. 28.

Figure 31:
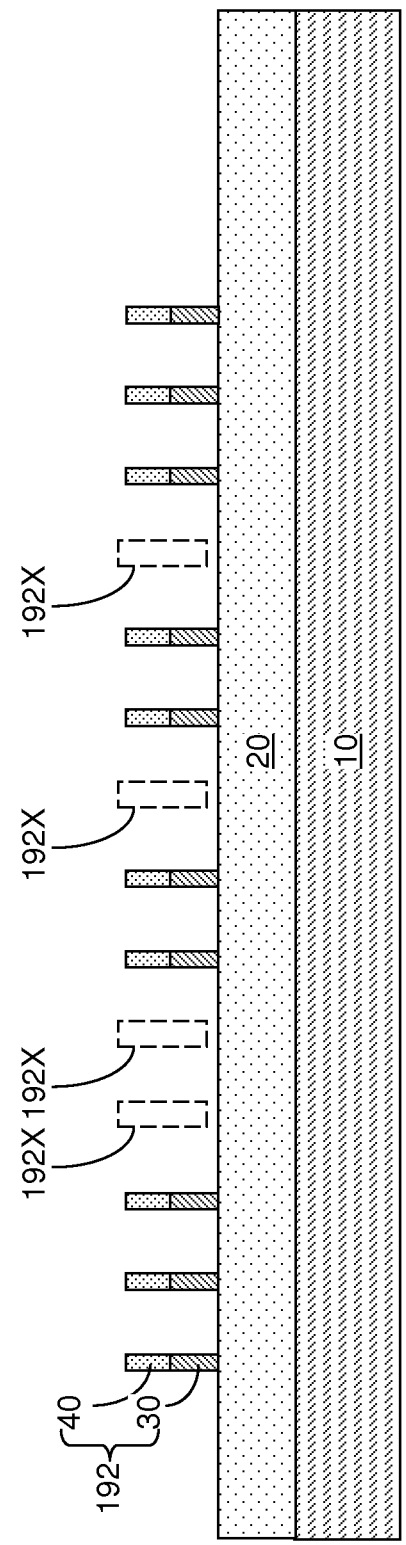
FIG. 31 is a vertical cross-sectional view of the second exemplary structure after removal of the fin-defining spacers according to the second embodiment of the present disclosure.

Referring to FIG. 31, end portions of each vertical stack of a semiconductor fin 30, a dielectric fin cap 40, and a fin-defining spacer 162 can be removed, for example, by forming a patterned mask layer (not shown) such as a patterned photoresist layer over center portions of the vertical stacks (30, 40, 162), while physically exposing end portions of the vertical stacks (30, 40, 162), and subsequently removing the physically exposed end portions of the vertical stacks (30, 40, 162) by an etch, which can include a wet etch and/or a dry etch. The patterned mask layer can be subsequently removed. The processing steps of FIGS. 11 and 11A can be employed at this step.

Subsequently, the fin-defining spacers 162 can be removed selective to the vertical stacks 192 of a semiconductor fin 30 and a dielectric fin 40 employing etch chemistries known in the art. In an embodiment, the portions of the fin-defining spacers 162 can constitute a one-dimensional array prior to the processing step of FIG. 21, a vacancy 192X of a vertical stack of a semiconductor fin and a dielectric fin can be present at locations from which a portion of a fin-defining spacer 162 is removed at the processing step of FIG. 23 or at the processing step of FIG. 28.

The methods of the present disclosure provide a wider lithographic overlay tolerance for patterning an array of parallel semiconductor fins by providing additional masking structures that are self-aligned to the mandrels and formed only on one side of each fin-defining spacer around each mandrel.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:
1. A method of forming a semiconductor structure comprising:
forming mandrel structures over a stack of a semiconductor layer and a dielectric layer;
forming fin-defining spacers on sidewalls of said mandrel structures;
forming mask material portions on first fin-defining spacer portions located on a first-side sidewall of each mandrel structure by a directional deposition of a mask material, wherein said mandrel structures shield second fin-defin- ing spacer portions located on a second-side sidewall of each mandrel structure from said mask material during said directional deposition;

forming a patterned mask layer including at least one opening therein over said mandrel structures, fin-defining spacers, and said mask material portions; and removing portions of said fin-defining spacers located within said at least one opening and not covered by said mask material portions in an anisotropic etch, while a subset of said mask material portions within said at least one opening protects underlying portions of said fin-defining spacers during said anisotropic etch.

2. The method of claim 1, further comprising etching said stack of said semiconductor layer and said dielectric layer in a second anisotropic etch employing remaining portions of said fin-defining spacers as an etch mask after said removing of said portions of said fin-defining spacers.

3. The method of claim 2, further comprising:
removing said patterned mask layer and said mask material portions selective to said remaining portions of said fin-defining spacers; and
removing said mandrel structures selective to said remaining portions of said fin-defining spacers prior to said second anisotropic etch.

4. The method of claim 2, wherein vertical stacks of a semiconductor fin and a dielectric fin are formed by said second anisotropic etch underneath said remaining portions of said fin-defining spacers, and said method further comprises removing said remaining portions of said fin-defining spacers after formation of said vertical stacks.

5. The method of claim 1, wherein topmost portions of said fin-defining spacers are vertically recessed from top surfaces of said mandrel structures upon formation of said fin-defining spacers.

6. The method of claim 1, wherein each of said fin-defining spacers are formed as a structure that laterally surrounds one of said mandrel structures and having a uniform thickness at bottom portions thereof.

7. The method of claim 1, wherein at least one of said mask material portions does not extend to a top surface of said dielectric layer.

8. The method of claim 1, wherein said directional deposition is performed along a beam direction at a non-zero angle relative to a surface normal of said dielectric layer.

9. The method of claim 8, wherein said mandrel structures have parallel vertical sidewalls, and said beam direction is within a two-dimensional plane including said surface normal of said dielectric layer and a surface normal of said parallel vertical sidewalls.

10. The method of claim 1, wherein said mandrel structures have parallel vertical sidewalls, and said mandrel structures constitute a one-dimensional array of mandrel structures having a pitch along a direction perpendicular to said parallel vertical sidewalls.

11. A method of forming a semiconductor structure comprising:
forming mandrel structures over a stack of a semiconductor layer and a dielectric layer;
forming fin-defining spacers on sidewalls of said mandrel structures;
forming a contiguous oxide layer on said fin-defining spacers, said mandrel structures, and said dielectric layer;
forming structurally-damaged oxide portions on first portions of said fin-defining spacers by implanting ions into portions of said contiguous oxide layer employing a directional ion implantation, wherein said mandrel structures shield second portions of said fin-defining spacers from said ions during said directional ion implantation;

forming a patterned mask layer including at least one opening therein over structurally-damaged oxide portions and unimplanted portions of said contiguous oxide layer; and removing a subset of said structurally-damaged oxide portions from within said at least one opening, while said unimplanted portions of said contiguous oxide layer protect underlying portions of said fin-defining spacers within said at least one opening.

12. The method of claim 11, further comprising removing physically exposed fin-defining spacers from within said at least one opening selective to said unimplanted portions of said contiguous oxide layer after said removing of said subset of said structurally-damaged oxide portions.

13. The method of claim 12, further comprising etching said stack of said semiconductor layer and said dielectric layer in an anisotropic etch employing remaining portions of said fin-defining spacers as an etch mask after said removing of said physically exposed fin-defining spacers.

14. The method of claim 13, further comprising:
removing said patterned mask layer, said structurally-damaged oxide portions, and said unimplanted portions of said contiguous oxide layer selective to said remaining portions of said fin-defining spacers; and
removing said mandrel structures selective to said remaining portions of said fin-defining spacers prior to said anisotropic etch.

15. The method of claim 13, wherein vertical stacks of a semiconductor fin and a dielectric fin are formed by said anisotropic etch underneath said remaining portions of said fin-defining spacers, and said method further comprises removing said remaining portions of said fin-defining spacers after formation of said vertical stacks.

16. The method of claim 11, wherein topmost portions of said fin-defining spacers are vertically recessed from top surfaces of said mandrel structures upon formation of said fin-defining spacers.

17. The method of claim 11, wherein each of said fin-defining spacers are formed as a structure that laterally surrounds one of said mandrel structures and having a uniform thickness at bottom portions thereof.

18. The method of claim 11, further comprising forming a dielectric spacer around each of said mandrel structures prior to forming said fin-defining spacers.

19. The method of claim 11, wherein said directional ion implantation is performed along a beam direction at a non-zero angle relative to a surface normal of said dielectric layer.

20. The method of claim 19, wherein said mandrel structures have parallel vertical sidewalls, and said beam direction is within a two-dimensional plane including said surface normal of said dielectric layer and a surface normal of said parallel vertical sidewalls.

* * * * *